United States Patent
Morishita et al.

(10) Patent No.: US 6,704,231 B1
(45) Date of Patent: Mar. 9, 2004

(54) SEMICONDUCTOR MEMORY DEVICE WITH CIRCUIT EXECUTING BURN-IN TESTING

(75) Inventors: Fukashi Morishita, Hyogo (JP); Mitsuya Kinoshita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/397,211

(22) Filed: Mar. 27, 2003

(30) Foreign Application Priority Data

Oct. 30, 2002 (JP) ........................................ 2002-316204

(51) Int. Cl.$^7$ ................................................ G11C 7/00
(52) U.S. Cl. ........................... 365/201; 365/226; 365/63
(58) Field of Search ................................ 365/201, 226, 365/63

(56) References Cited

U.S. PATENT DOCUMENTS

| 5,258,954 A | * | 11/1993 | Furuyama | 365/201 |
| 5,822,258 A | * | 10/1998 | Casper | 365/201 |
| 5,943,276 A | * | 8/1999 | Casper | 365/201 |
| 6,088,819 A | * | 7/2000 | Adachi et al. | 714/718 |
| 6,134,162 A | * | 10/2000 | Casper | 365/201 |
| 6,449,208 B1 | * | 9/2002 | Kono et al. | 365/226 |

FOREIGN PATENT DOCUMENTS

JP        P2001-250398 A        9/2001

* cited by examiner

*Primary Examiner*—Son T. Dinh
(74) *Attorney, Agent, or Firm*—McDermott, Will & Emery

(57) ABSTRACT

A semiconductor memory device includes an isolation unit isolating a bit line in a first region including a memory cell formed of a thick film transistor and a second region including a sense amplifier formed of a thin film transistor. Voltage supply lines are provided corresponding to respective regions. In a test mode, the isolation unit isolates the two regions. A voltage for testing is supplied from the voltage supply line. Thus, a voltage for testing corresponding to a thick film transistor and a thin film transistor can be supplied to allow efficient execution of a burn-in test.

9 Claims, 22 Drawing Sheets

FIG.7

| | CONTROL SIGNAL | | | VBLa | | VBLs | | CPL | |
|---|---|---|---|---|---|---|---|---|---|
| | WLBIE | CBS | CBT | VOLTAGE | SUPPLY | VOLTAGE | SUPPLY | VOLTAGE | SUPPLY |
| NORMAL OPERATION | L | L | L | 1/2Vcc | VBL GENERATION CIRCUIT 150 | 1/2Vcc | VBL GENERATION CIRCUIT 150 | 1/2Vcc | VCP GENERATION CIRCUIT 160 |
| WLBI CPL-VBLa STRESS | H | H | L | GND | TRANSISTOR TR7 | | | Vccb | VBL GENERATION CIRCUIT 150 |
| WLBI VBLa-CPL STRESS | H | | H | Vccb | PAD PD0 | | PAD PD1 | GND | TRANSISTOR TR9 |

FIG.11

| WLBI MODE | | WLBIE | CBS | CBT | CPL | VBLa | VBLs | BLEQ | S0 | BLI | WL3 | WL2 | WL1 | WL0 |
|---|---|---|---|---|---|---|---|---|---|---|---|---|---|---|
| ALL WL ACTIVATION MODE | | | | | | | | | | | VddH | | | |
| EVEN NUMBER WL ACTIVATION MODE | | H | | | | Vcca | | VddH | GND | GND | GND | VddH | GND | VddH |
| ODD NUMBER WL ACTIVATION MODE | | | | | | | | | | | VddH | GND | VddH | GND |
| CELL CHECKER MODE | STRIPE TYPE MODE | | | L | 1/2 Vcca | | 1/2 Vcca | | | | | VddH | | |
| | S1 | | | | | | | | | | | | | |
| | S2 | | | | | GND | | | | | VddH | GND | | |
| | S3 | | | | | Vcca | | | | | | | GND | |
| | S4 | | | | | 1/2 Vcca | | GND | Vcc | VddH | | | | VddH |
| | S5 | | | | | | | | | | VddH | | | |

FIG.18

| | | CONTROL SIGNAL | | | | VBLa | | VBLs | | CPL | |
|---|---|---|---|---|---|---|---|---|---|---|---|
| | | WLBIE | CBS | CBT | CBP | POTENTIAL | SUPPLY | POTENTIAL | SUPPLY | POTENTIAL | SUPPLY |
| NORMAL OPERATION | | L | L | L | L | 1/2Vcc | VBL GENERATION CIRCUIT 150 | 1/2Vcc | VBL GENERATION CIRCUIT 150 | 1/2Vcc | VCP GENERATION CIRCUIT 160 |
| FWBI | CPL-VBLa STRESS | H | H | L | H | GND | TRANSISTOR TR7 | 1/2Vcc | VBL GENERATION CIRCUIT 150 | Vcc | TRANSISTOR TR9 |
| | VBLa-CPL STRESS | | | H | | Vcc | TRANSISTOR TR7 | | | GND | TRANSISTOR TR9 |

FIG.22

| | WLBIE | CBP | CBS | CBT | SN1 | SN2 | CPL | VBLa | VBLs | BLEQ | S0 | BLI | WL3 | WL2 | WL1 | WL0 |
|---|---|---|---|---|---|---|---|---|---|---|---|---|---|---|---|---|
| FWBI MODE | | | | | | | | | | | | | | | | |
| ALL WL ACTIVATION MODE | | | | | | | | | | | | | | VddH | | |
| EVEN NUMBER WL ACTIVATION MODE | H | H | | | H | L | 1/2 Vcc | Vcc | 1/2 Vcc | VddH | GND | GND | GND | VddH | GND | VddH |
| ODD NUMBER WL ACTIVATION MODE | | | | | | | | GND | | | | | VddH | GND | VddH | GND |
| CELL CHECKER MODE | S1 | | | | L | L | H | | Vcc | | | | | VddH | GND | VddH | GND |
| | S2 | | | | H | | | | | | | | | | | | |
| | S3 | | | | | | | | | | | | | VddH | GND | VddH |
| STRIPE TYPE MODE | S4 | | | | L | L | | 1/2 Vcc | | GND | Vcc | VddH | | GND | | | |
| | S5 | | | | | | | | | | | | VddH | | | | |

SEMICONDUCTOR MEMORY DEVICE WITH CIRCUIT EXECUTING BURN-IN TESTING

BACKGROUND OF THE INVENTION

1. Field of the Invention

The present invention relates to semiconductor memory devices, particularly to a semiconductor memory device including a circuit executing testing for reliability evaluation.

2. Description of the Background Art

Recently, attention is focused on logic-embedded devices having various logic circuits incorporated on one chip. These logic-embedded devices generally have a structure in which various types of transistors are employed according to the function and application. Specifically, from the standpoint of high speed operation and power consumption, two types of transistors differing in the thickness of the oxide film are embedded in the circuit. For example, with regards to a data readout operation of data stored in a memory array, a thin film transistor is employed for a sense amplifier that requires high speed operation whereas a thick film transistor for applying boosted voltage is employed for an access transistor to access a selected memory cell.

The reliability testing of a device will be described hereinafter. In general, failure of a device is mainly divided into three periods, i.e., the initial failure period, the incidental failure period, and the wear failure period over time. Initial failure occurs immediately at the start of usage, representing any defect of the device fabrication. Most of the defects related to margin belong to this type. Such failure rapidly decreases over time. Then, the incidental failure period follows during which a low failure rate is exhibited continuously over a long constant period of time. Then, the failure rate suddenly increases as the device approaches its durable term (wear failure period). It is desirable that the device is used within the incidental failure period. This period corresponds to the lifetime. Therefore, the need arises for a device that has a low and constant incidental failure rate and a long incidental failure period in order to improve the reliability of the device.

For the purpose of removing any initial failure in advance, screening to remove defective products must be carried out by subjecting the device to an acceleration operation aging for a predetermined period of time. In order to effectively conduct such screening in a short period of time, it is desirable that the initial failure rate rapidly decreases over time to expedite entering the incidental failure period. One generally known screening method is the high temperature operation test (burn-in testing). A wafer level burn-in testing that is conducted in a wafer state is particularly effective. This method allows the dielectric film of a transistor or the like to be directly evaluated actually using a device. Various factors of failures such as interconnection shorting can be rapidly elicited by applying high temperature and high electric field stress. Japanese Patent Laying-Open No. 2001-250398 discloses a structure to execute burn-in testing on a wafer level using a precharge voltage supply line to precharge a bit line in a memory array.

However, the problem of the thin film transistor being destroyed if a voltage for burn-in testing corresponding to a thick film transistor is applied to a thin film transistor is associated with the logic-embedded devices incorporating the aforementioned two different types of transistors.

SUMMARY OF THE INVENTION

In view of the foregoing, an object of the present invention is to provide a semiconductor memory device that allows execution of burn-in testing effectively in a logic-embedded device and the like.

According to an aspect of the present invention, a semiconductor memory device includes a plurality of memory cells having charge stored corresponding to storage data, a bit line, a peripheral circuit, an isolation unit, first and second voltage supply lines, and a voltage control circuit. A bit line is connected to a selected memory cell among the plurality of memory cells in a data readout mode. The peripheral circuit is connected to a bit line in a data readout mode to execute data reading with respect to the selected memory cell. The isolation unit electrically isolates the bit line into first and second regions of a bit line corresponding to the plurality of memory cells and the peripheral circuit, respectively, as necessary. The first voltage supply line is provided corresponding to the bit line in the first region. The second voltage supply line is provided corresponding to the bit line in the second region. The voltage control circuit controls the voltage to be supplied to the first and second voltage supply lines. The voltage control circuit supplies the same voltage to the first and second voltage supply lines in an operation mode, and supplies different voltages to the first and second voltage supply lines in a test mode.

The bit lines are isolated into the first and second regions, and each region corresponds to a different voltage supply line. The voltage control circuit supplies the same voltage in an operation mode and different voltages in a test mode to the first and second voltage supply lines. Therefore, a voltage corresponding to one and the other of the regions can be supplied from a corresponding voltage supply line in a test mode. Thus, test voltage can be applied in an efficient manner.

According to another aspect of the present invention, a semiconductor memory device includes a memory cell storing charge corresponding to storage data, a bit line, a voltage supply line, and a voltage control circuit. The bit line transmits a voltage of a level corresponding to the storage data in a memory cell in a data readout mode. The voltage supply line supplies a cell plate voltage to the memory cell. The memory cell includes an access transistor and a capacitor. The access transistor provided between a storage node and a bit line is turned on in a data readout mode. The capacitor provided between the storage node and the voltage supply line retains charge. In a test mode, the access transistor is turned off. The voltage control circuit supplies different voltages respectively to the voltage supply line and bit line in a test mode.

According to the above-described structure, testing can be conducted with stress applied between the bit line and voltage supply line without applying high stress on the capacitor to identify any defect between signal lines.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 shows the relationship between control signals and each voltage supply line when in a normal operation mode and when stress is applied between a voltage supply line and bit line.

FIG. 11 shows various test modes and the relationship between corresponding control signals and voltage supply lines according to the first embodiment.

FIG. 18 shows the relationship of control signals when stress is applied between a voltage supply line and bit line and when in a normal operation mode of the second embodiment.

FIG. 22 shows various testing modes and the relationship between corresponding control signals and voltage supply lines according to the second embodiment.

DESCRIPTION OF THE PREFERRED EMBODIMENTS

Figure 1:
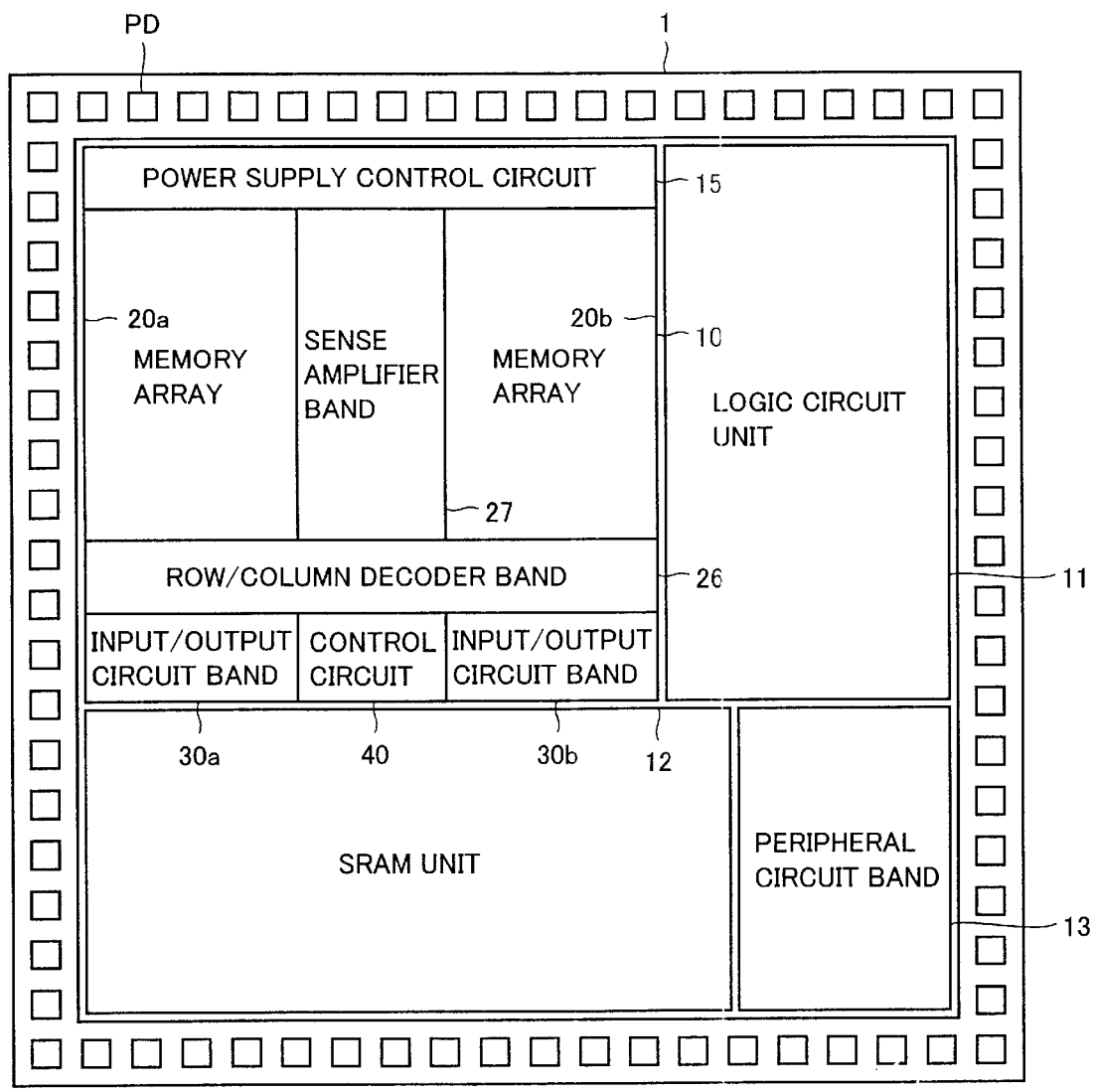
FIG. 1 shows an entire structure of a semiconductor memory device according to a first embodiment of the present invention.

Embodiments of the present invention will be described in detail hereinafter with reference to the drawings. In the drawings, the same or corresponding components have the same reference characters allotted, and description thereof will not be repeated.

First Embodiment

Referring to FIG. 1, a semiconductor memory device 1 according to the first embodiment of the present invention includes a DRAM (Dynamic Random Access Memory) unit 10 used as a memory to store a large amount of data, a logic circuit unit 11 executing various logic operation, an SRAM (Static Random Access Memory) unit 12 used as a memory to process data at high speed, and a peripheral circuit band 13 used for connection and the like of respective elements. Semiconductor memory device 1 further includes a plurality of external pads PD provided at the periphery of the device.

Figure 2:
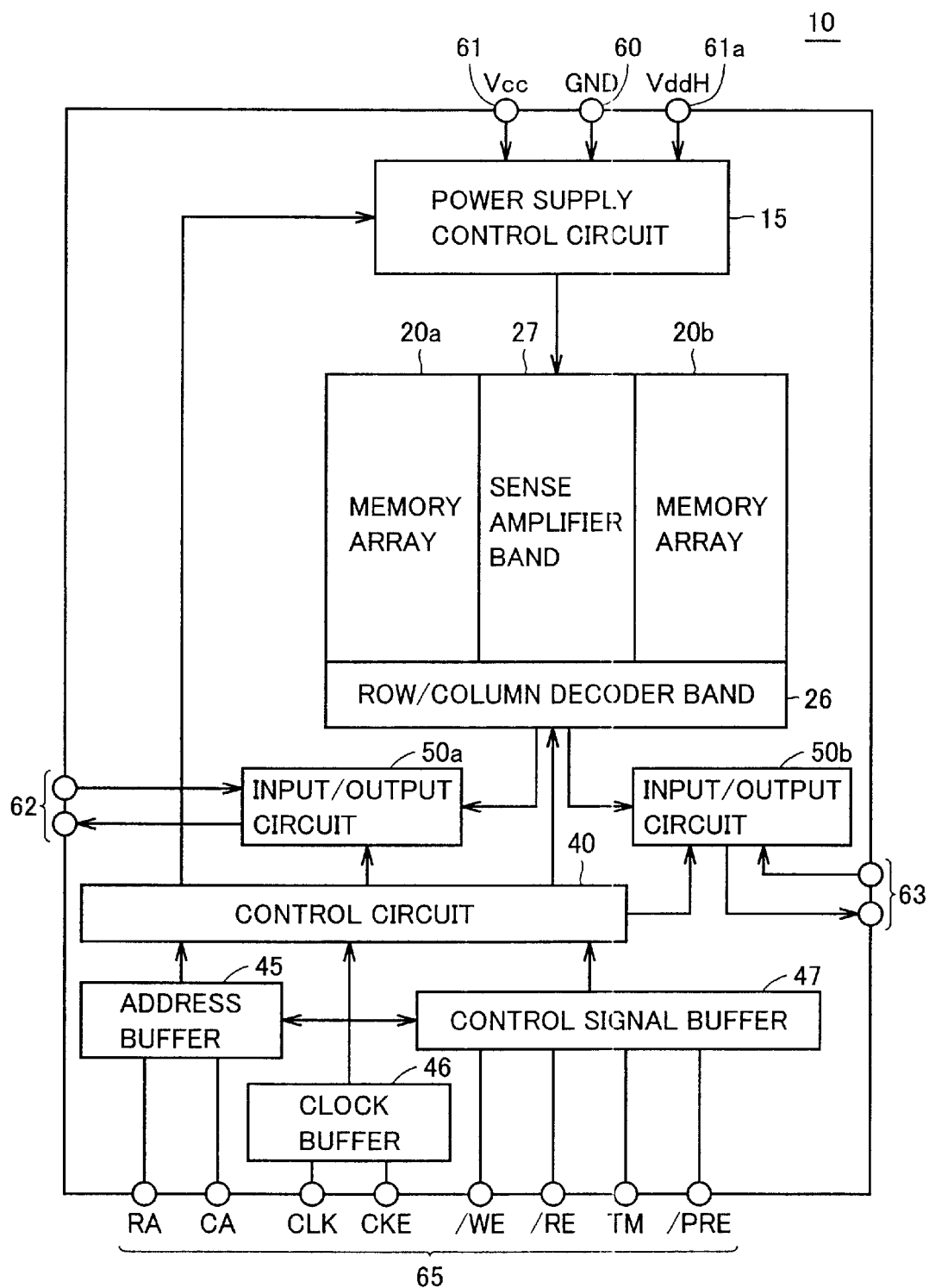
FIG. 2 schematically shows a DRAM according to the first embodiment.

Referring to FIG. 2, DRAM unit 10 of the first embodiment includes a power supply pins 60, 61, and 61a, input/output pins 62 and 63 employed for data input/output, and a control signal pin group 65 formed of a plurality of control signal pins to which are applied control signals employed for control of DRAM unit 10.

DRAM unit 10 further includes a power supply control circuit 15 supplying operating voltage and the like to internal circuitry, memory arrays 20a and 20b where memory cells to store data are integrated and arranged, an input/output circuit 50a provided corresponding to memory array 20a to execute data input/output with respect to input/output pin 62, an input/output circuit 50b provided corresponding to memory array 20b to execute data input/output between input/output pin 63 and memory array 20b, and a control circuit 40 controlling the entire operation of DRAM unit 10. Power supply control circuit 15 receives supply of a ground voltage GND, a power supply voltage Vcc, and a high power supply voltage VddH from power supply pins 60, 61 and 61a, respectively.

DRAM unit 10 also includes an address buffer 45 buffering and outputting to control circuit 40 the inputs of a row address RA and a column address CA applied from the control signal pins of control signal pin group 65, a clock buffer 46 receiving inputs of a clock signal CLK and a clock enable signal CKE applied from control signal pins of control signal pin group 65 to output an internal clock signal to control circuit 40 as well as to other peripheral circuitry, and a control signal buffer 47 buffering and outputting to control circuit 40 a control signal /WE related to data writing, a control signal /RE related to data reading, a control signal TM related to the testing mode, and a control signal /PRE related to the precharge mode, applied from the control signal pins of control signal pin group 65. The above "/" symbol indicates inversion, negation, complementary, and the like. The same applies to the description in the following.

Figure 3:
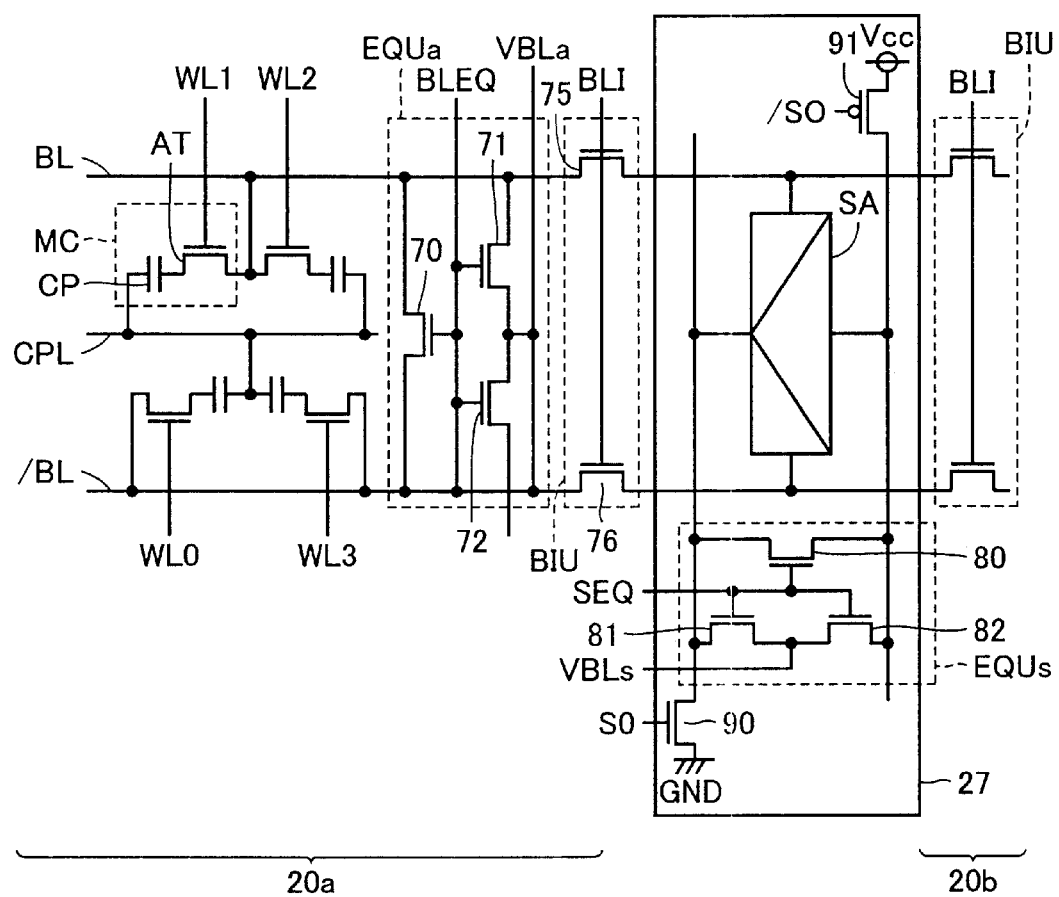
FIG. 3 schematically shows a circuit configuration of a memory array and a peripheral circuit region according to the first embodiment.

Referring to FIG. 3, memory array 20a according to the first embodiment of the present invention includes memory cells MC arranged in a matrix. Although description is provided hereinafter based on memory array 20a, memory array 20b has a similar structure.

Memory array 20a has bit lines BL and /BL complementary to each other provided corresponding to two adjacent memory cell columns. Also, a plurality of word lines are provided corresponding to respective memory cell rows. Memory cells corresponding to bit lines BL and /BL are connected to word lines differing from each other. In the present embodiment, the two memory cells MC corresponding to bit line /BL are connected to respective word lines WL0 and WL3. The two memory cells MC corresponding to bit line BL are connected to respective word lines WL1 and WL2. The remaining portion has a similar structure.

Memory array 20a includes an equalize unit EQUa to precharge and equalize bit lines BL and /BL. Equalize unit EQUa includes transistors 70–72. Transistor 70 is disposed between bit line BL and bit line /BL, and has its gate electrically coupled to a select line BLEQ. Transistors 71 and 72 are disposed in series between bit lines BL and /BL, and have their gates electrically coupled to select line BLEQ. The connection node of transistors 71 and 72 is electrically coupled to a voltage supply line VBLa receiving supply of precharge voltage. By way of example, transistors 70–72 are N channel MOS transistors.

Memory array 20a includes a select gate BIU provided for every pair of bit lines BL and /BL to control the electrical connection between a sense amplifier SA and bit lines BL, /BL. Select gates BIU are disposed at respective sides of sense amplifier SA. Select gate BIU functions as a select gate of memory array 20a at one side and as the select gate of memory array 20b at the other side. Specifically, sense amplifier SA of the present embodiment forms the so-called shared sense amplifier to render a corresponding select gate BIU active in response to selection of memory arrays 20a and 20b.

Select gate BIU includes transistors 75 and 76. Transistors 75 and 76 control the electrical connection between bit lines BL and /BL and sense amplifier SA, and receive an input of select line BLI at respective gates. By way of example, transistors 75 and 76 are N channel MOS transistors.

Sense amplifier band 27 includes a sense amplifier SA provided for every bit line pair BL and /BL, an equalize unit EQUs, a transistor 91 supplying power supply voltage Vcc to sense amplifier SA, and a transistor 90 supplying ground voltage GND to sense amplifier SA. Transistors 90 and 91 are rendered active in response to control signals SO and /SO, respectively. By way of example, transistors 90 and 91 are an N channel MOS transistor and a P channel MOS transistor, respectively.

Equalize unit EQUs includes transistors 80–82. Transistor 80 disposed between transistors 90 and 91 has its gate electrically coupled to select line SEQ. Transistors 81 and 82 connected in series between transistors 90 and 91 have their gates electrically coupled to select line SEQ. The connection node of transistors 81 and 82 is electrically coupled to voltage supply line VBLs receiving supply of a precharge voltage. By way of example, transistors 80–82 are N channel MOS transistors.

Figure 4:
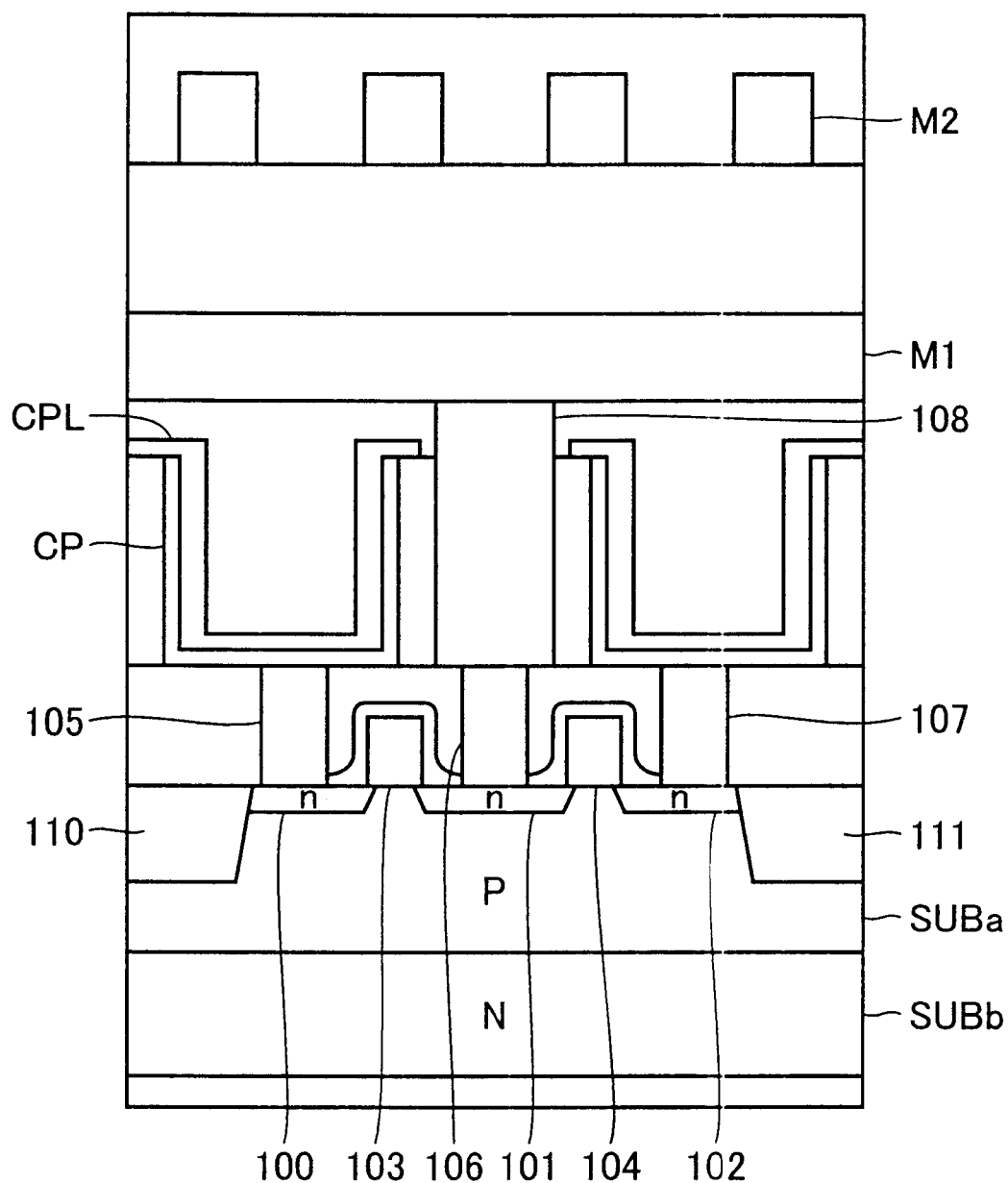
FIG. 4 is a sectional view of the structure of two adjacent memory cells according to the first embodiment.

A memory cell MC of the first embodiment will be described with reference to FIG. 4 showing two adjacent memory cells MC corresponding to bit line BL.

In the present embodiment, a memory cell MC of a COB (Capacitor Over Bit line) structure generally employed in a logic-embedded device will be described. This structure has a bit line formed at the top layer of the capacitor of a memory cell.

Referring to FIG. 4, a P type semiconductor substrate SUBa is formed on an N type semiconductor substrate SUBb to form a memory cell MC. An access transistor AT of memory cell MC includes N type impurity regions 100 and 101 formed on semiconductor substrate SUBa, and a gate region 103 covered with a sidewall. Impurity region 100 is electrically coupled with capacitor CP located at an upper region via a metal film formed in a contact hole 105. Capacitor CP is electrically coupled with a cell plate voltage supply line CPL (hereinafter referred to as "voltage supply line CPL") formed so as to cover capacitor CP. Impurity region 101 is electrically coupled with a bit line BL formed at a metal layer M1 formed upper than capacitor CP via the metal film formed in a contact hole 106. Current does not have to be conducted intentionally through the word line since a word line is provided for the purpose to control the gate voltage of access transistor AT. Therefore, it is of general practice to have word line WL formed at an interconnection layer identical to that of gate 103 using a polysilicon layer or a polysilicide layer from the standpoint of improving integration. Since the polysilicon layer and polysilicide layer are of relatively high resistance, a structure of reducing the resistance by backing with a metal interconnection layer M2 of aluminum or the like at an upper layer through a contact hole or the like not shown is generally employed.

The adjacent memory cell is formed in a similar manner. The access transistor of the adjacent memory cell MC includes N type impurity regions 101 and 102 formed on semiconductor substrate SUBa, and a gate region 104. Impurity region 102 is electrically coupled with a cell plate voltage supply line via capacitor CP located at the upper region via a metal film formed in a contact hole 107. Since impurity region 101 can be shared with two adjacent memory cells, the layout area of memory cells can be reduced to improve integration. The memory cell of the COB structure type has bit line BL and the cell plate voltage supply line located relatively in close proximity due to its structure as shown in FIG. 4.

Figure 5:
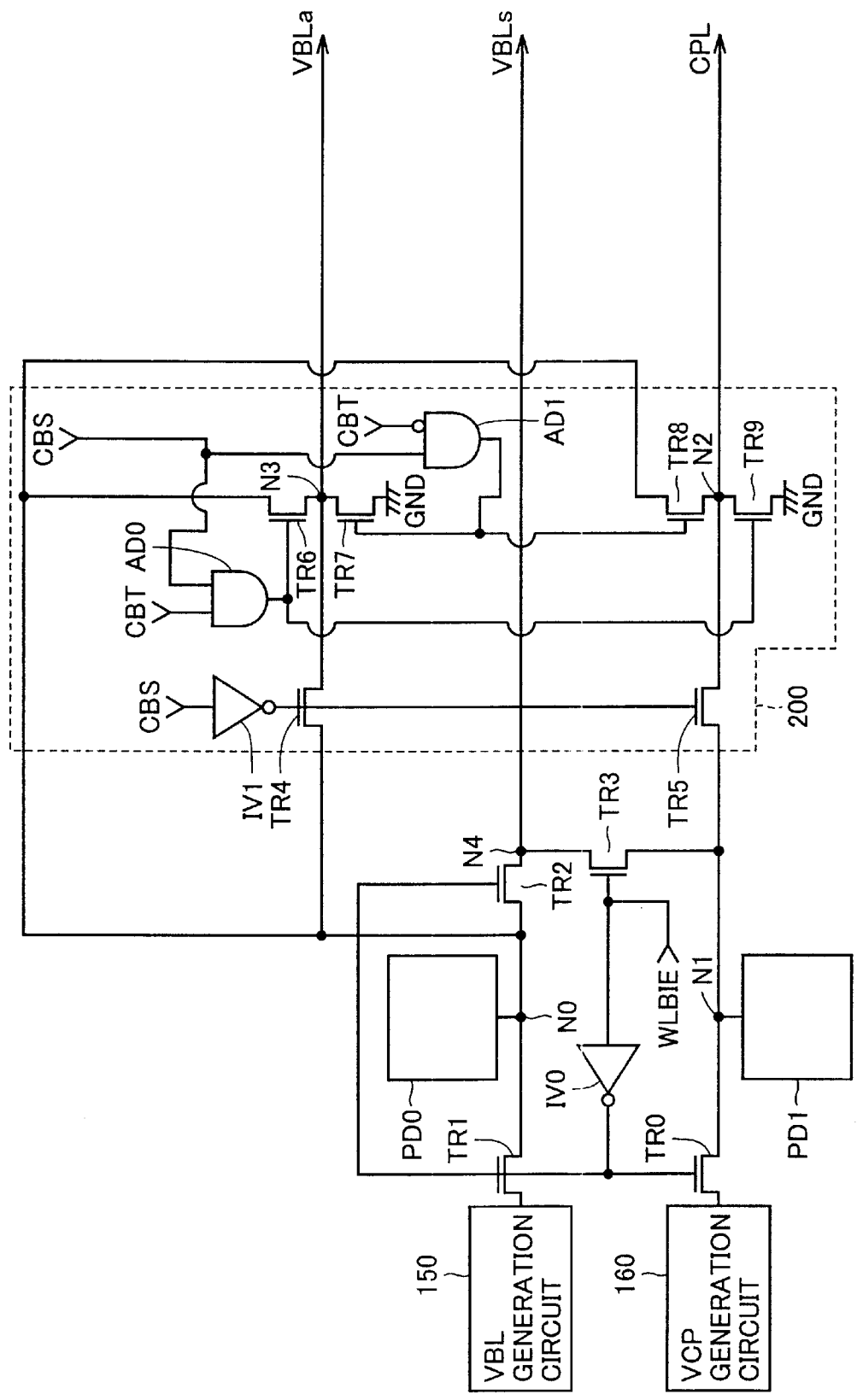
FIG. 5 is a schematic diagram of a voltage supply circuit of the first embodiment included in a power supply control circuit.

Referring to FIG. 5, the voltage supply circuit of the first embodiment included in power supply control circuit 15 supplies desired voltages to respective voltage supply lines VBLa, VBLs and CPL. Specifically, the voltage supply circuit 15 includes a VBL generation circuit 150 generating a precharge voltage VBL to precharge a bit line, a VCP generation circuit 160 generating cell plate voltage VCP, transistors TR0–TR3, an inverter IV0, external pads PD0 and PD1, and a switch control unit 200.

Transistor TR0 is disposed between VCP generation circuit 160 and a node N1, and receives an inverted version of a control signal WLBIE via inverter IV0 at its gate. Transistor TR1 disposed between a node N0 and VBL generation circuit 150 receives the input of the inverted version of control signal WLBIE via inverter IV0. Transistor TR2 disposed between nodes N0 and N4 receives the input of the inverted version of control signal WLBIE via inverter IV0 at its gate. Transistor TR3 disposed between nodes N1 and N4 receives the input of control signal WLBIE at its gate. Switch control unit 200 is provided corresponding to nodes N0 and N1 to switch the voltage supplied to respective voltage supply lines VBLa and CPL in response to an input control signal.

Control signal WLBIE is a control signal rendered active in a burn in-test mode, as necessary. In the case where control signal WLBIE is set to an H level (logical high), for example, transistors TR0 and TR1 are turned off. Accordingly, supply of a voltage from VBL generation circuit 150 and VCP generation circuit 160 is ceased. Transistor TR3 is turned on to establish electrical coupling between nodes N1 and N4. Accordingly, a burn-in voltage can be supplied to voltage supply lines VBLa, VBLs and CPL using external pads PD0 and PD1 in a burn-in test mode.

Switch control unit 200 includes an inverter IV1, transistors TR4–TR9, and AND circuits AD0 and AD1. Transistor TR4 disposed between nodes N0 and N3 receives an inverted version of control signal CBS via inverter IV1 at its gate. Transistor TR5 disposed between nodes N1 and N2 receives an input of the inverted version of control signal CBS via inverter IV1 at its gate.

Transistor TR6 disposed between nodes N0 and N3 receives an output signal from AND circuit AD0 at its gate. Transistor TR7 disposed between node N3 and ground voltage GND receives an output signal from AND circuit AD1 at its gate. Transistor TR8 disposed between nodes N0 and N2 receives an output signal from AND circuit AD1 at its gate. Transistor TR9 disposed between node N2 and ground voltage GND receives an output signal from AND circuit AD0 at its gate. AND circuit AD0 receives the input of control signal CBT and control signal CBS to output an AND logic operation result to the gates of respective transistors TR6 and TR9. AND circuit AD1 receives the input of control signal CBS and the inverted version of control signal CBT to output the AND logic operation result to the gates of respective transistors TR7 and TR8.

Node N3 is electrically coupled with voltage supply line VBLa. Node N4 is electrically coupled with voltage supply line VBLs. Node N2 is electrically coupled with voltage supply line CPL.

Switch control unit 200 switches the voltage to be supplied to each voltage supply line according to the logic levels of control signals CBS and CBT.

Specifically, switch control unit 200 functions in response to an input of control signal CBS (H level) and switches the voltage to be supplied to voltage supply lines VBLa and CBL according to the logic level of control signal CBT. For example, in the case where control signal CBS is at an H level, node N0 is electrically cut off from node N3 via transistor TR4. Also, node N1 is electrically cut off from node N2 via transistor TR5. In this case, transistor TR6 is turned on in response to control signal CBT (H level). Also, node N1 is electrically cut off from node N2 via transistor TR5. In this case, transistor TR6 is turned on in response to control signal CBT (H level), whereby electrical coupling is established via transistor TR6 between node N3 and node N0 electrically connected to external pad PD0. In response to transistor TR9 turned on, node N2 is electrically coupled with ground voltage GND. In other words, voltage supply line VBLa receives supply of voltage from external pad PD0. Voltage supply line CPL receives supply of ground voltage GND.

In response to control signal CBT (L level), transistor TR7 is turned on. Accordingly, voltage supply line VBLa receives supply of ground voltage GND. In response to transistor TR8 turned on, electrical coupling is established between node N2 and node N0 connected to external pad PD0. Accordingly, voltage supply line CPL receives supply from external pad PD0.

Figure 6:
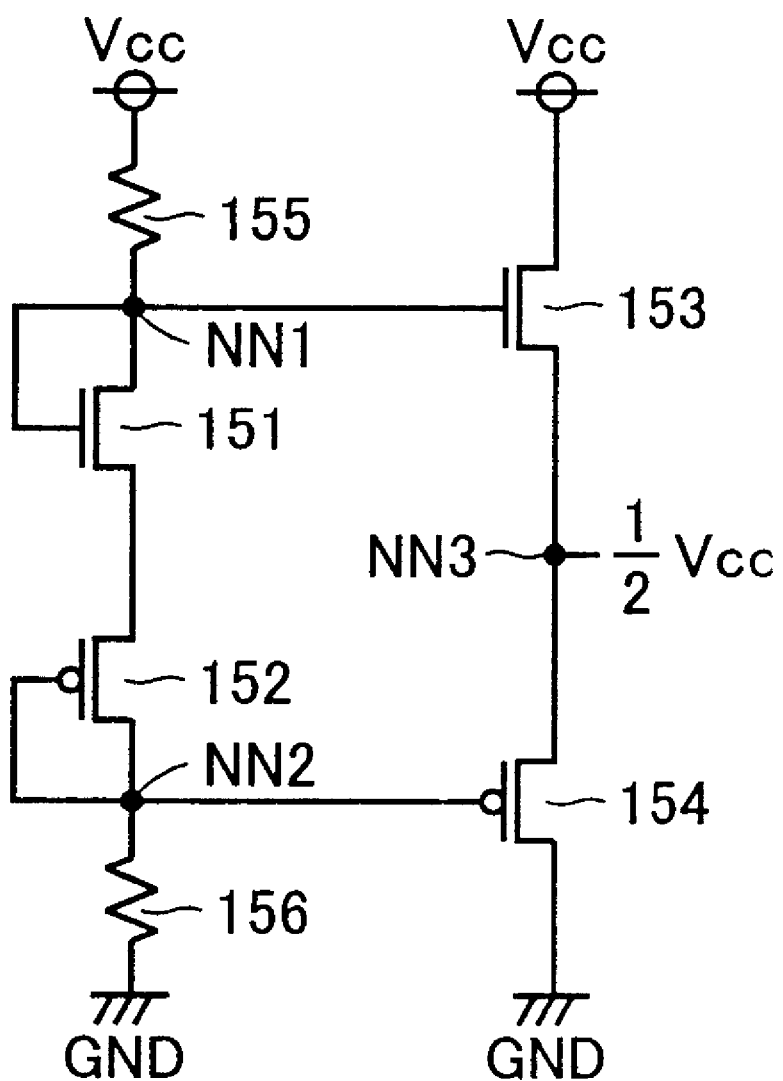
FIG. 6 is a circuit diagram of a VBL generation circuit according to the first embodiment.

Referring to FIG. 6, VBL generation circuit 150 of the first embodiment includes transistors 151–154, and resistors 155 and 156.

Resistor 155 is disposed between power supply voltage Vcc and a node NN1. Transistor 151 disposed between node NN1 and transistor 152 is electrically coupled with node NN1 at its gate. Transistor 152 disposed between a node NN2 and transistor 151 is electrically coupled with node NN2 at its gate. Resistor 156 is disposed between ground voltage GND and node NN2. Transistor 153 disposed between power supply voltage Vcc and an output node NN3 is electrically coupled with node NN1 at its gate. Transistor 154 disposed between output node NN3 and ground voltage GND is electrically coupled with node NN2 at its gate. By way of example, transistors 151 and 153 are N channel MOS transistors. By way of example, transistors 152 and 154 are P channel MOS transistors.

VBL generation circuit 150 supplies voltage ½ Vcc that is half power supply voltage Vcc to voltage supply lines VBLa and VBLs as the precharge voltage. Specifically, when transistors 151 and 152 are equal in ON-resistance, a voltage of a level corresponding to the resistance ratio of resistor 155 to resistor 156 is generated at output node NN3. In this case, the voltage level of output node NN3 can be adjusted to voltage ½ Vcc by setting the resistance ratio of resistor 155 to 156 as 1:1.

VCL generation circuit 160 has a similar structure, and supplies voltage ½ Vcc to voltage supply voltage line CPL as the cell plate voltage. The specific circuit configuration and the like are similar to those of VBL generation circuit 150. Therefore, description thereof will not be repeated.

The relationship between control signals and each voltage supply line when in a normal operation mode and when stress is applied between voltage supply line CPL and bit line BL will be described with reference to FIG. 7.

First, a normal operation mode will be described. In a normal operation mode, control signals WLBIE, CBS and CBT are all set at an L level. It is assumed that, in a normal operation mode, a precharge period to equalize and precharge bit lines BL and /BL to a predetermined level as well as a precharged period to precharge the sense amplifier are included.

Figure 8:
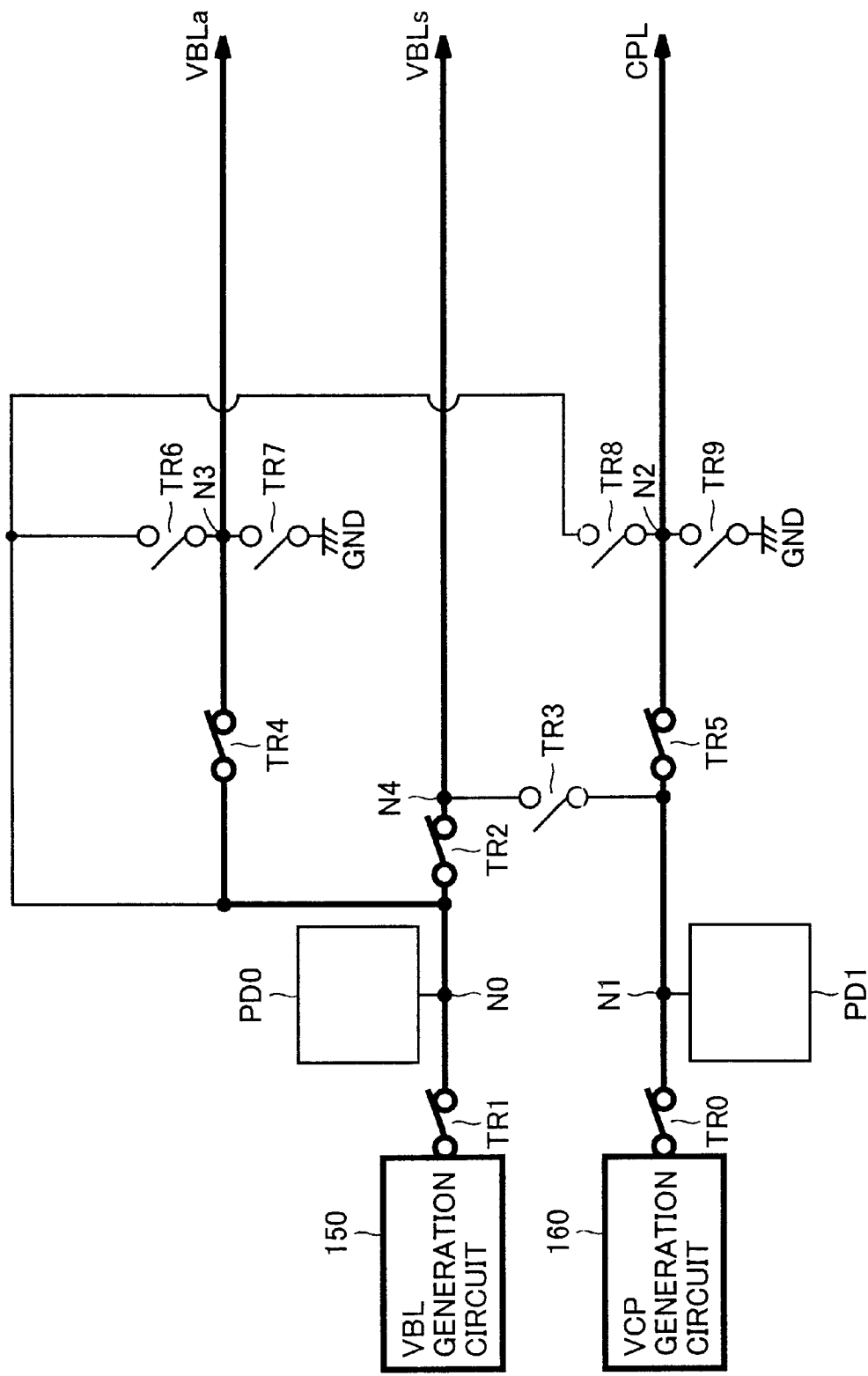
FIG. 8 is a schematic diagram of the supply path of a voltage supply circuit of the first embodiment in a normal operation mode.

Referring to FIGS. 7 and 8, the precharge voltage from VBL generation circuit 150 is supplied to voltage supply line VBLa via transistors TR1 and TR4 in response to input control signals WLBIE, CBS and CBT. Similarly, the precharge voltage from VBL generation circuit 150 is supplied to voltage supply line VBLs via transistors TR1 and TR2. Also, the cell plate voltage from VCP generation circuit 160 is supplied to voltage supply line CPL via transistors TR0 and TR5. In a normal operation mode, the same voltage ½ Vcc is applied to respective voltage supply lines VBLa, VBLs and CPL.

Consider the case where stress is applied between voltage supply line CPL and bit line BL in a wafer level burn-in test mode (WLBI). First, the case will be described where a power supply voltage Vccb higher than power supply voltage Vcc is applied to voltage supply line CPL, and ground voltage GND is applied to bit line BL. In the following, this is also termed "CPL-VBLa stress".

In this test mode, control signals WLBIE and CBS are set at an H level. Control signal CBT is set at an L level.

Figure 9:
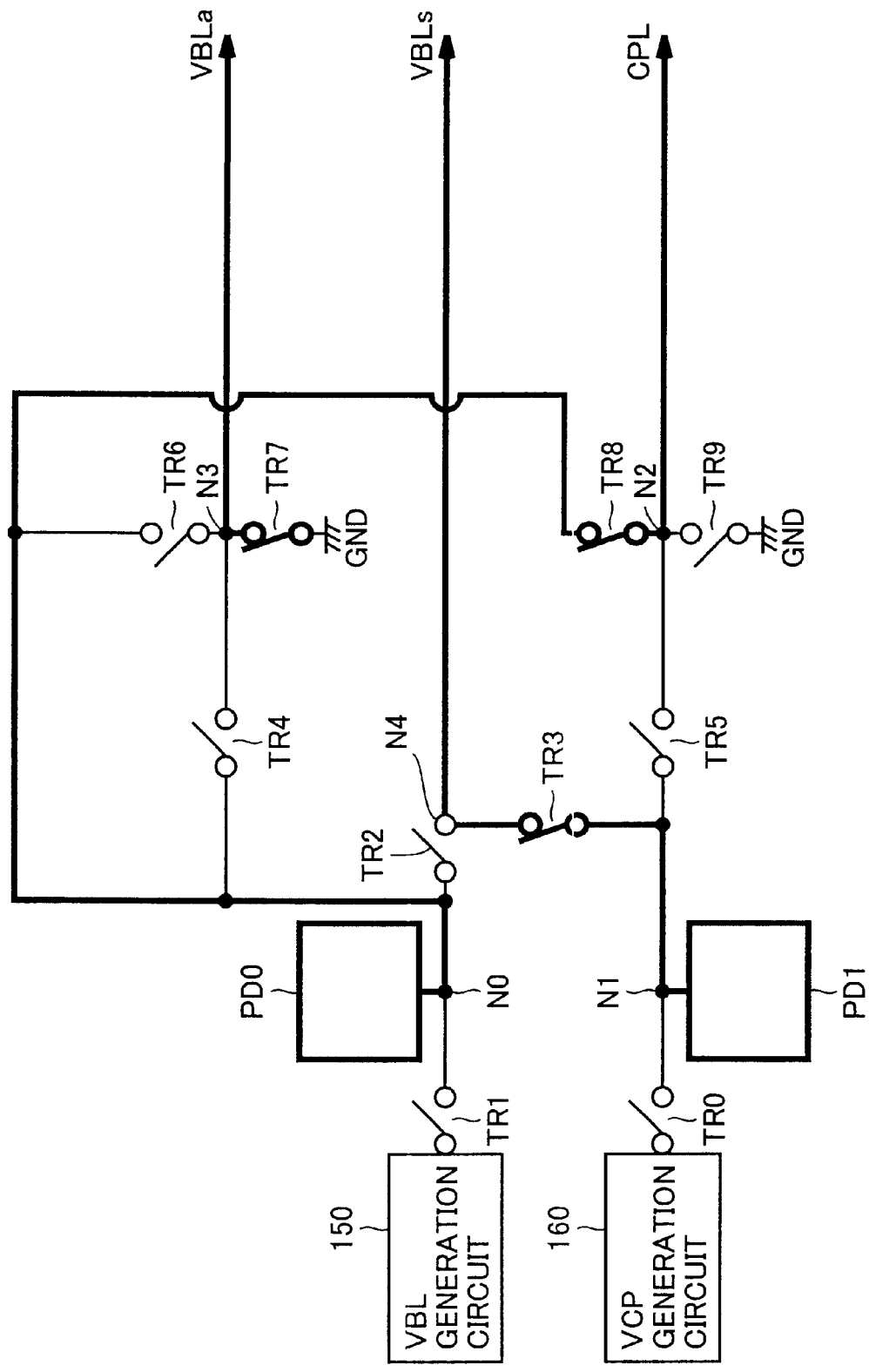
FIGS. 9 and 10 are schematic diagrams of the supply path of the voltage supply circuit of the first embodiment when CPL-VBLa stress is applied.

Referring to FIGS. 7 and 9, transistor TR8 is turned on in response to control signals CBS and CBT, whereby node N2 is electrically coupled with external pad PD0. Also, transistor TR7 is turned on, whereby ground voltage GND is electrically coupled with voltage supply line VBLa. In response to control signal WLBIE, transistor TR3 is turned on, whereby node N1 is electrically coupled with node N4.

In the present embodiment, power supply voltage Vccb for testing is supplied to external pad PD0. Also, voltage ½ Vcc is supplied to external pad PD1.

In this testing mode, select lines BLEQ and SEQ are set at an H level. Accordingly, equalize unit EQUs is supplied with precharge voltage ½ Vcc from external pad PD1, whereby sense amplifier SA is precharged. Equalize unit EQUa has bit lines BL, /BL with voltage supply line VBLa electrically coupled. Therefore, bit lines BL and /BL receive supply of ground voltage GND from voltage supply line VBLa. Voltage supply line CPL receives supply of power supply voltage Vccb from external pad PD0. In this case, it is assumed that all word lines WL connected to each memory cell MC are set at an inactive state.

By the supply of power supply voltage Vccb to voltage supply line CPL and the supply of ground voltage GND to bit lines BL and /BL according to the present structure, stress of high field is applied therebetween. Accordingly, interconnection failure and the like between bit line BL and voltage supply line CPL can be tested. As mentioned previously, bit line BL and the cell plate voltage supply line are located in close proximity in a memory cell of the COB structure generally employed in the logic-embedded device. This means that there is high possibility of shorting therebetween. The present testing mode is particularly advantageous in that failure can be identified at high accuracy. An effective burn-in test can be executed.

Since all word lines WL are inactive, the stress of high electric field will not be applied to the capacitor in the memory cell. The present test mode can be executed without destroying the capacitor in the memory cell.

Since sense amplifier SA is at a precharged state by the supply of a precharged voltage of ½ Vcc through voltage supply line VBLs, burn-in testing can be executed efficiently without causing erroneous operation.

Next, a testing mode will be described where a high voltage is applied to bit line BL and a low voltage is supplied to voltage supply line CPL. This will be termed "VBLa-CPL stress" hereinafter.

In this testing mode, control signals WLBIE and CBS are set at an H level. Control signal CBT is set at an H level.

Figure 10:
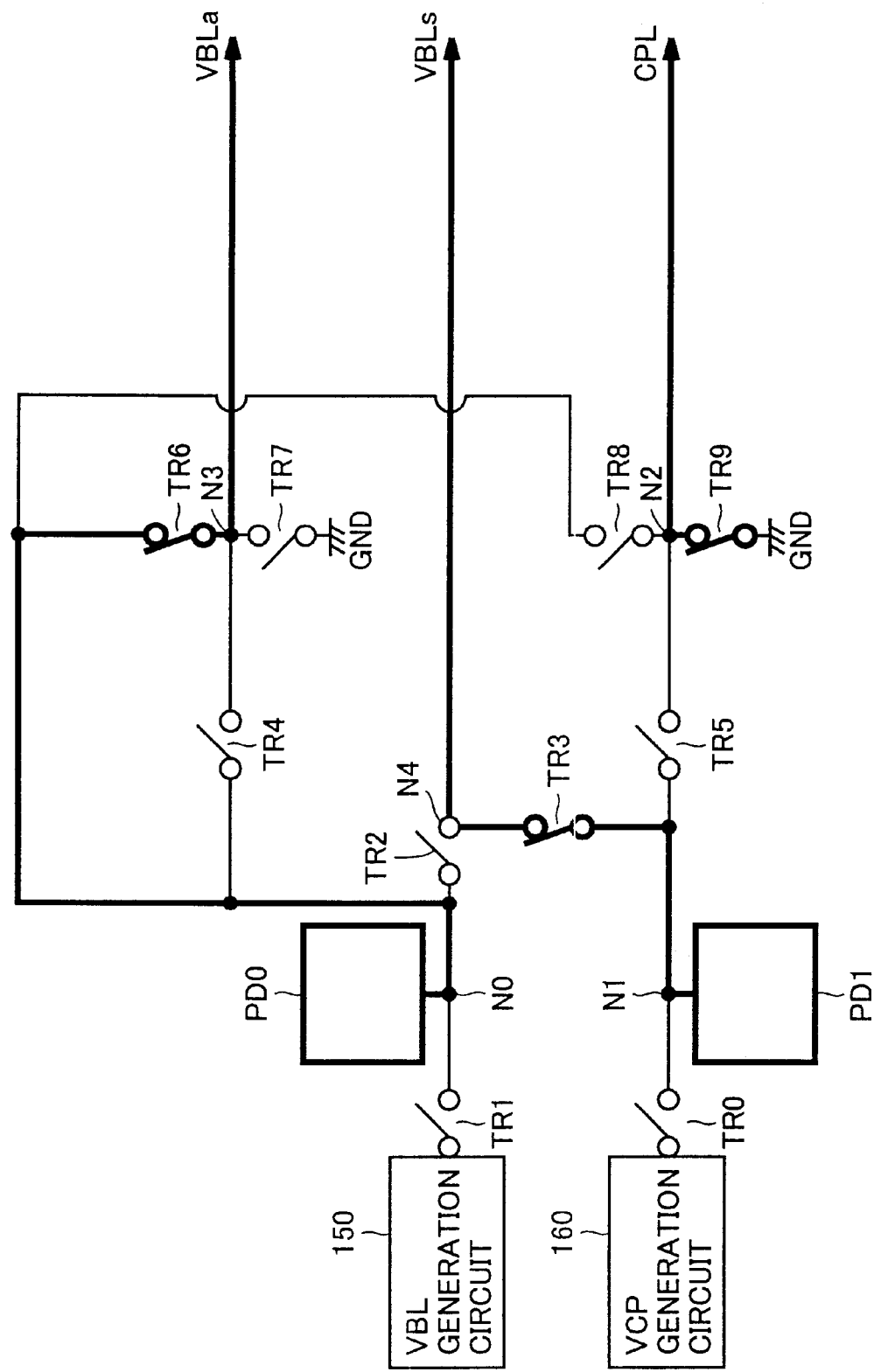

Referring to FIGS. 7 and 10, transistor TR9 is turned on in response to control signals CBS and CBT, whereby node N2 is electrically coupled with ground voltage GND. Also, transistor TR6 is turned on, whereby node N0 connected to external pad PD0 is electrically coupled with node N3. In response to control signal WLBIE, transistor TR3 is turned on, whereby node N1 connected to external pad PD1 is electrically coupled with node N4.

Power supply voltage Vccb for testing is supplied to external pad PD0, likewise the previous testing mode. Also, voltage ½ Vcc is supplied to external pad PD1.

Select lines BLEQ and SEQ are set at an H level. Therefore, sense amplifier SA receives supply of precharge voltage ½ Vcc to attain a precharged state. Bit lines BL and /BL receive supply of power supply voltage Vccb from voltage supply line VBLa. Ground voltage GND is supplied to voltage supply line CPL. All word lines WL connected to each memory cell MC are set at an inactive state.

By the supply of ground voltage GND to voltage supply line CPL and the supply of power supply voltage Vccb to bit lines BL and /BL according to the above-described structure, stress of high electric field is applied therebetween. Accordingly, interconnection failure and the like between bit line BL and voltage supply line CPL can be tested. Testing can be executed readily since the required test voltage can be supplied through the external pad.

Various testing modes and the relationship between corresponding control signals and voltage supply lines of the first embodiment will be described with reference to FIG. 11.

In this case, control signal WLBIE is set at an H level whereas control signals CBS and CBT are set at an L level.

Figure 12:
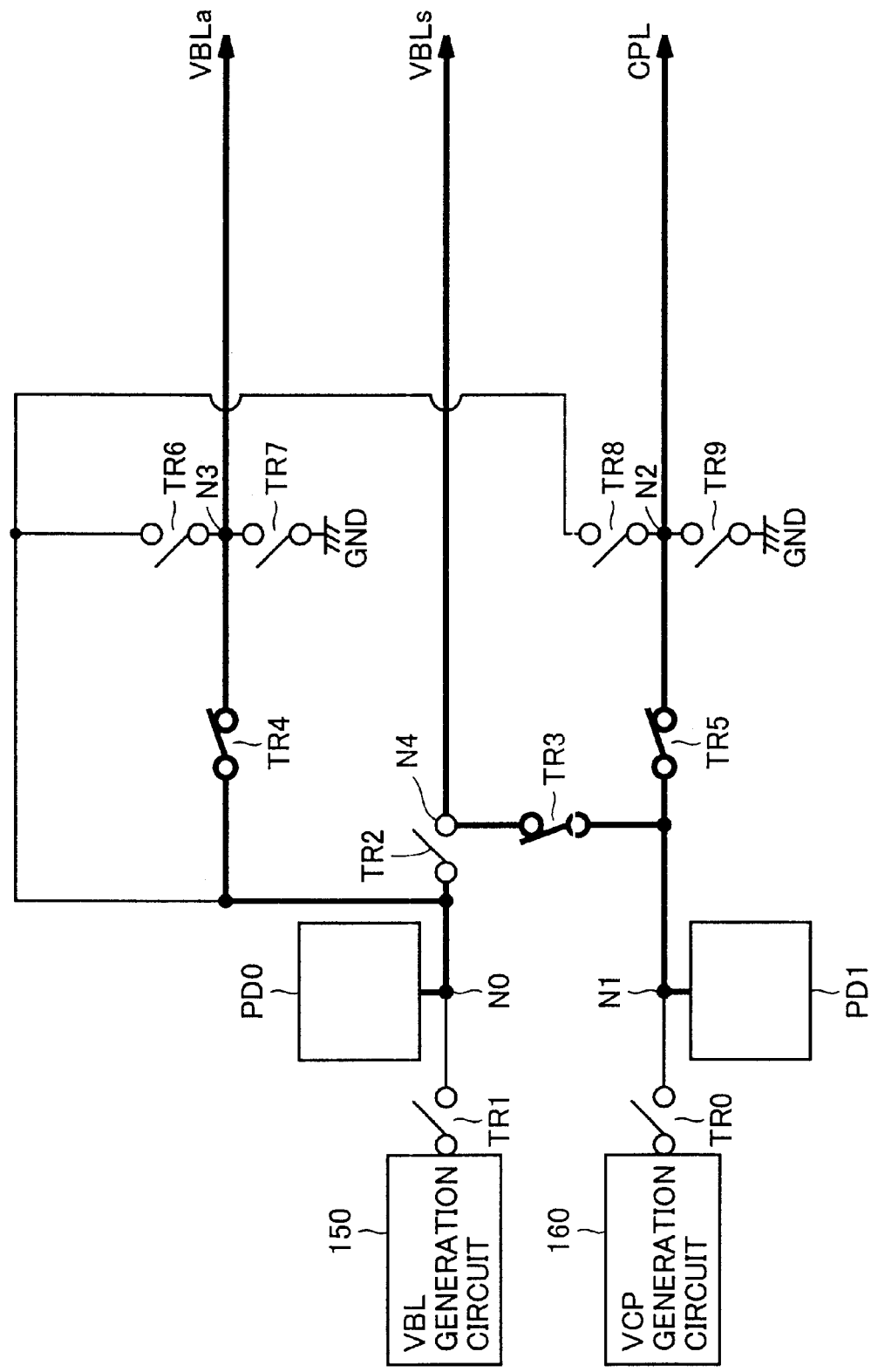
FIG. 12 is a schematic diagram of the supply path of the voltage supply circuit when various test modes are executed.

Referring to FIG. 12, transistor TR4 is turned on in response to control signals CBS and CBT, whereby node N0 connected to external pad PD0 is electrically coupled with node N3. Also, transistor TR5 is turned on, whereby node N1 connected to external pad PD1 is electrically coupled with node N2. In response to control signal WLBIE, transistors TR0 and TR1 are turned off, whereby the supply of voltages from VBL generation circuit 150 and VCP generation circuit 160 is ceased. In response to control signal WLBIE, transistor TR3 is turned on, whereby node N1 connected to external pad PD1 is electrically coupled with node N4. In other words, voltage supply line VBLa receives voltage supply from external pad PD0. Also, voltage supply lines VBLs and CPL receive voltage supply from external pad PD1.

First, a testing mode where all word lines WL are rendered active in parallel will be described (also termed "all-WL activation mode" hereinafter).

In this all-WL activation mode, external pad PD0 is electrically coupled with power supply voltage Vcca that is higher than power supply voltage Vcc, by way of example. Accordingly, power supply voltage Vcca is supplied to voltage supply line VBLa. Voltage ½ Vcc is supplied to external pad PD1. Therefore, voltage supply lines CPL and VBLs are supplied with the voltage of ½ Vcca. Also, since select line BLEQ is set at a high power supply voltage VddH (H level), transistors 70–72 are all turned on, whereby bit lines BL and /BL are electrically coupled with voltage supply line VBLa. Therefore, power supply voltage Vcca is supplied to bit lines BL and /BL.

In this case, high power supply voltage VddH is supplied to all the word lines WL. Accordingly, all the transistors electrically coupled with word line WL are turned on, whereby data is written into the capacitor of each memory cell. In other words, data of "0" or "1" can be written into all memory cells. In the present embodiment, it is assumed that data 1 is written. Reliability testing of a memory cell can be executed based thereon.

Specifically, desired data is written appropriately into all memory cells MC. Then, any defective memory cell MC that could not be written is rejected. Thus, the chip reliability can be improved. Furthermore, since a voltage VddH higher than power supply voltage Vcc is applied to the gate of the transistor as the voltage for burn-in testing, reliability on the insulation film of the transistor can be tested.

In the case where reliability testing is executed for a memory cell that has such a thick film transistor, select line BLI is electrically coupled with ground voltage GND. Therefore, the sense amplifier band formed of thin film transistors is insulated from the bit line electrically connected to the memory cell. In the present testing mode, power supply voltage Vcca will not be supplied to the thin film transistor. Therefore, burn-in testing can be executed efficiently without destroying the thin film transistor.

A cell checker mode for executing reliability testing on a portion of memory cells will be described hereinafter.

Figure 13:
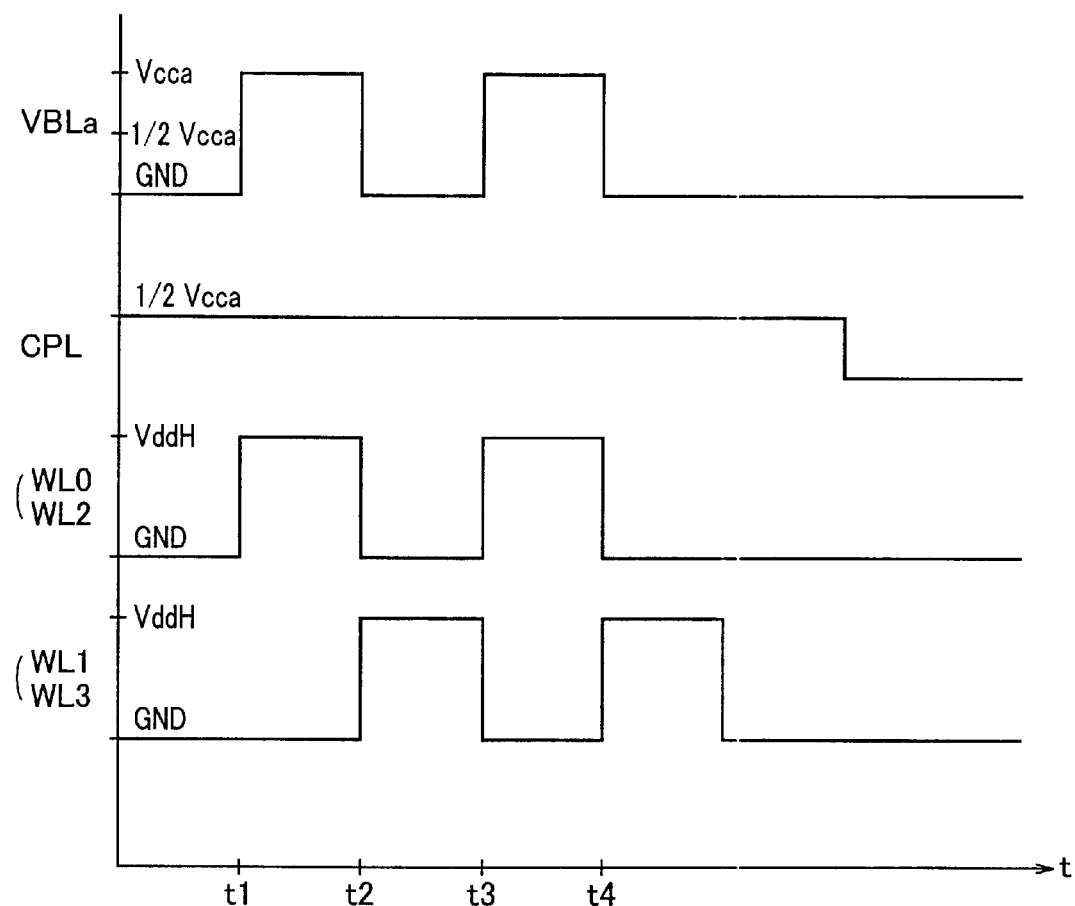
FIG. 13 is a timing chart of rendering active all even-numbered word lines to execute reliability testing.

Specifically, reliability testing of rendering active all even number word lines WL and executing data writing of data "1" (also referred to as even number WL activation mode" hereinafter) will be described with reference to the timing chart of FIG. 13. This mode differs from the above-described all-WL activation mode in that data "1" is written into memory cells corresponding to an even numbered word line WL.

Specifically, at time t1, power supply voltage Vcca is supplied from external pad PD0 to voltage supply line VBLa. Also, even numbered word lines WL0 and WL2 are rendered active. In response, data "1" is written into memory cells corresponding to even numbered word lines WL0, WL2, . . .

At time t2, ground voltage GND is supplied to voltage supply line VBLa from external pad PD0. Also, odd numbered word lines WL1, WL3 are rendered active. In response, data "0" is written into memory cells corresponding to odd numbered word lines WL1, WL3, . . .

Accordingly, a data pattern is formed that retains different data between adjacent memory cells MC in the memory array. Thus, any defect between adjacent memory cells MC can be detected.

At time t3, an operation similar to that of time t1 is executed again. At time t4, an operation similar to that of time t2 is repeated. The accuracy of reliability testing can be improved by repeating a predetermined data writing operation.

It is to be noted that a high power supply voltage VddH is supplied to even numbered word lines whereas ground voltage GND is supplied to odd numbered word lines. By applying stress between an even numbered word line and an odd numbered word line, a burn-in test accelerating defects between word lines can be executed.

Figure 14:
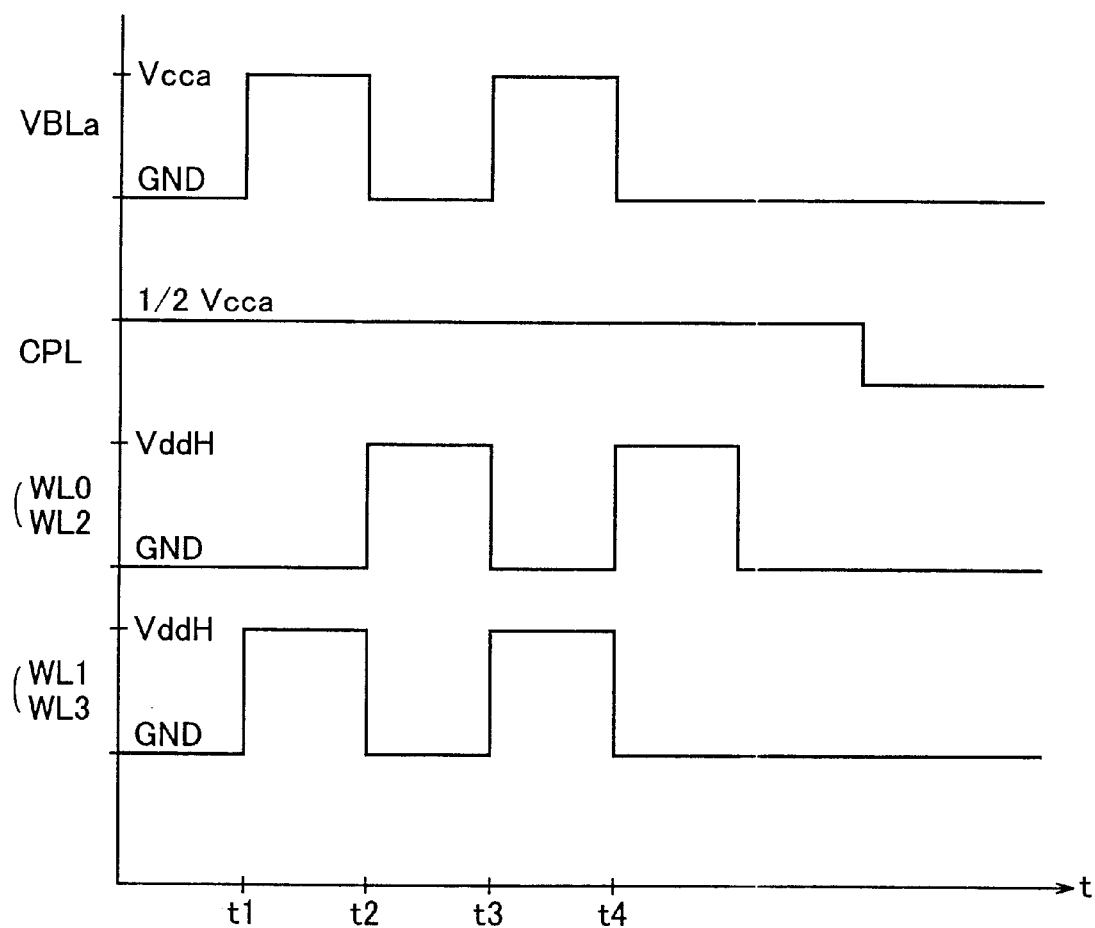
FIG. 14 is a timing chart rendering active all odd-numbered word lines to execute reliability testing.

Next, reliability testing will be described for executing data writing of data "1" into memory cells corresponding to all odd numbered word lines WL (also termed "odd number WL activation mode" hereinafter) with reference to the timing chart of FIG. 14.

This mode differs from the above-described even number WL activation mode in that the activation pattern of word lines WL has the even numbered one interchanged with the odd numbered one. A data pattern opposite to that of the even number WL activation mode can be written with respect to the memory array. Defects of memory cells MC can be detected in a similar manner. It is to be noted that, in the above burn-in test, a staggered data pattern can be written into the memory array by writing different data between adjacent memory cells.

Figure 15:
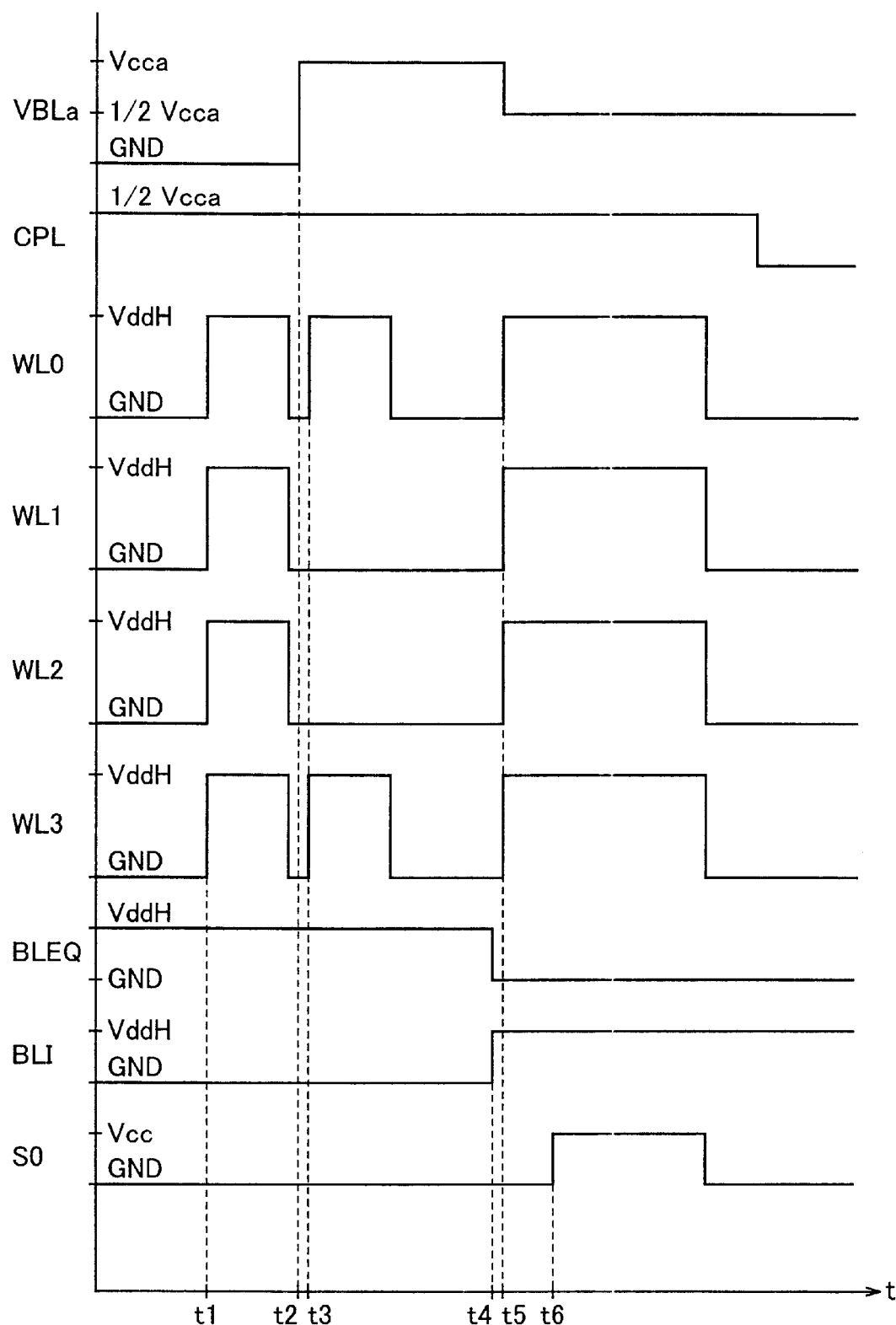
FIG. 15 is a timing chart of a stripe type mode.

The testing mode of writing different data alternately for every memory cell column in the memory array (also referred to as "stripe type mode" hereinafter) will be described with reference to the timing chart of FIG. 15. In the present mode, reliability testing is executed in 5 steps.

At time t1, data "0" or "1" is written into all memory cells MC as the first step S1. In the present embodiment, data "0" is written. Specifically, ground voltage GND is supplied at external pad PD0. Select line BLEQ is set at the level of high power supply voltage VddH (H level), and ground voltage GND is supplied from voltage supply line VBLa to bit lines BL and /BL. Then, all word lines WL are rendered active. Accordingly, data "0" can be written into all memory cells MC.

At step S2, data "1" is written into memory cells corresponding to bit line /BL.

At time t2, power supply voltage Vcca is supplied to voltage supply line VBLa from external pad PD0. Also, high power supply voltage VddH is supplied to select line BLEQ. Power supply voltage Vcca is supplied from voltage supply line VBLa to bit lines BL and /BL.

At time t3, word line WL corresponding to bit line /BL is rendered active. In the present embodiment, high power supply voltage VddH (H level) is supplied to word lines WL0 and WL3. Accordingly, data writing is executed of writing data "1" into memory cells corresponding to bit line /BL.

At step S3, voltage supply from voltage supply line VBLa is ceased.

Specifically, at time t4, ground voltage GND is supplied to select line BLEQ. Accordingly, bit lines BL and /BL are electrically isolated, whereby the supply of voltage from voltage supply line VBLa is ceased. Also, high power supply voltage VddH is supplied to select line BLI. Accordingly, sense amplifier band 27 is electrically coupled with bit lines BL and /BL.

At step S4, all word lines WL are rendered active.

At time t5, all word lines WL are set at the level of high power supply voltage VddH (H level). Therefore, memory cell MC is electrically coupled with bit line BL or /BL.

At step S5, sense amplifier SA is rendered active.

Specifically, at step t6, control signal S0 and /S0 are set at the level of power supply voltage Vcc (H level) and ground voltage GND (L level), respectively. Accordingly, transistors 90 and 91 are turned on. Sense amplifier SA of the cross coupled type (not shown) functions to maintain the voltage level of bit line BL and /BL. Specifically, the voltage level of bit line BL according to data "0" in memory cells MC corresponding to word lines WL1 and WL2 and the voltage level of bit line /BL according to data "1" in memory cell MC corresponding to word lines WL0 and WL3 are maintained. By rendering sense amplifier SA active, the charge stored in the capacitor of each memory cell can be retained.

Since data of "0" and "1" is alternately written for every bit line, data writing of a stripe type data pattern can be executed with respect to the memory array.

By executing data writing with various data patterns on the memory cell as described above, the accuracy of the memory cell reliability test can be improved.

In the above-described burn-in test of the first embodiment, ground voltage GND is supplied to select line BLI in a data writing operation at each testing mode. The sense amplifier band formed of thin film transistors is applied with power supply voltage Vcca. Therefore, a burn-in test can be executed efficiently without the thin film transistor being destroyed. It is to be also noted that sense amplifier band is supplied with voltage ½ Vcca from voltage supply line VBLs, and transistors 90 and 91 are equalized. Therefore, erroneous operation at sense amplifier SA can be prevented. Sense amplifier SA is precharged at the level of ½ Vcca that is the intermediate voltage level between power supply voltage Vcca and ground voltage GND. Therefore, excessive stress will not be applied to select gate BIU located at the boundary between a thick film transistor and a thin film transistor. Leakage current during an OFF state is suppressed to reduce power consumption.

Using two external pads PD, voltage can be supplied to three voltage supply lines VBLa, VBLs and CPL. Particularly for devices that are limited in external pads, the voltage supply circuit according to the first embodiment can be used effectively. According to the present structure, test voltage can be supplied using the voltage supplied lines directed to precharge the bit line. Therefore, a burn-in test can be executed efficiently without increasing the number of components in the circuit.

Modification of First Embodiment

The previous first embodiment was described based on a structure of supplying an effective burn-in voltage using two external pads during testing for a device that has strict limitation in external pads.

As a modification of the first embodiment, a structure supplying a desired burn-in voltage to each voltage supply line during testing in a device that has no particular limitation in external pads will be described.

Figure 16:
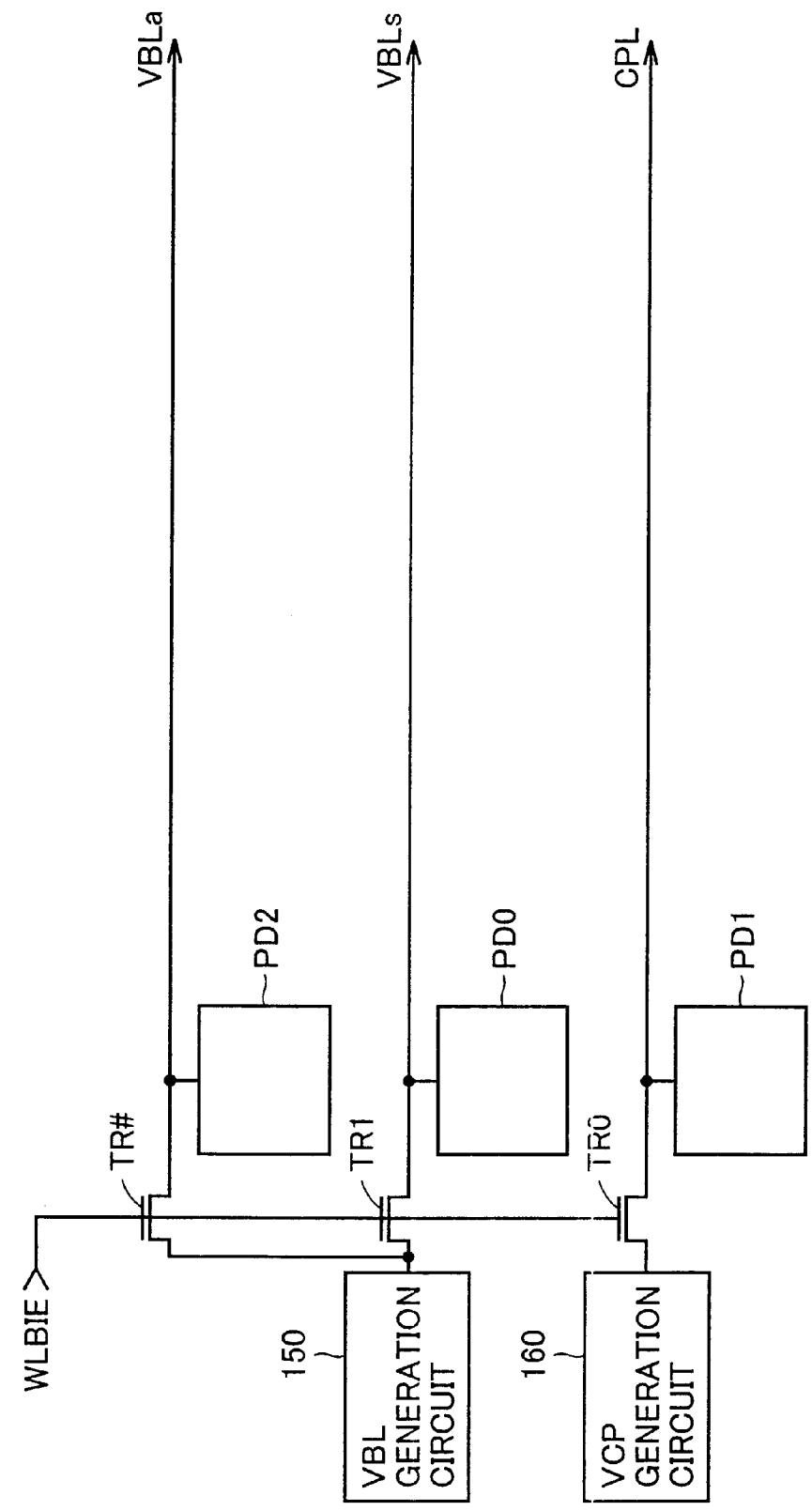
FIG. 16 shows a structure of a voltage supply circuit according to a modification of the first embodiment.

Referring to FIG. 16, a voltage supply circuit according to a modification of the first embodiment differs from the voltage supply circuit shown in FIG. 5 in that switch control unit 200, transistors TR2 and TR3 and inverter IV0 are absent, and a transistor TR# and an external pad PD2 are additionally provided.

In the present modification, transistors TR# and TR1 are provided between VBL generation circuit 150 and respective voltage supply lines VBLa and VBLs. Each gate receives supply of a control signal WLBIE. Also, transistor TR0 is provided between VCP generation circuit 160 and voltage supply line CPL. Transistor TR0 receives control signal WLBIE at its gate. Pads PD2, PD0 and PD1 are provided corresponding to voltage supply lines VBLa, VBLs and CPL, respectively.

In the present modification, control signal WLBIE is set at an L level during execution of the above-described burn-in test of the first embodiment. Accordingly, supply of a precharge voltage to each voltage supply line from VBL generation circuit 150 and VCP generation circuit 160 is ceased. Also, the desired voltage described with reference to FIGS. 7 and 11 is supplied to respective external pads PD0–PD2. Accordingly, a burn-in test similar to that described above in the first embodiment can be executed for a device that is not restricted in external pads.

Second Embodiment

The above first embodiment was described based on a structure of executing a burn-in test by supplying a desired power supply voltage for testing from external pads PD0 and PD1 provided for testing.

External pads PD0, PD1 and the like used for testing are generally disabled after packaging.

The second embodiment of the present invention will be described based on a structure that allows execution of a burn-in mode (FWBI) after packaging without using external pads PD0 and PD1.

Figure 17:
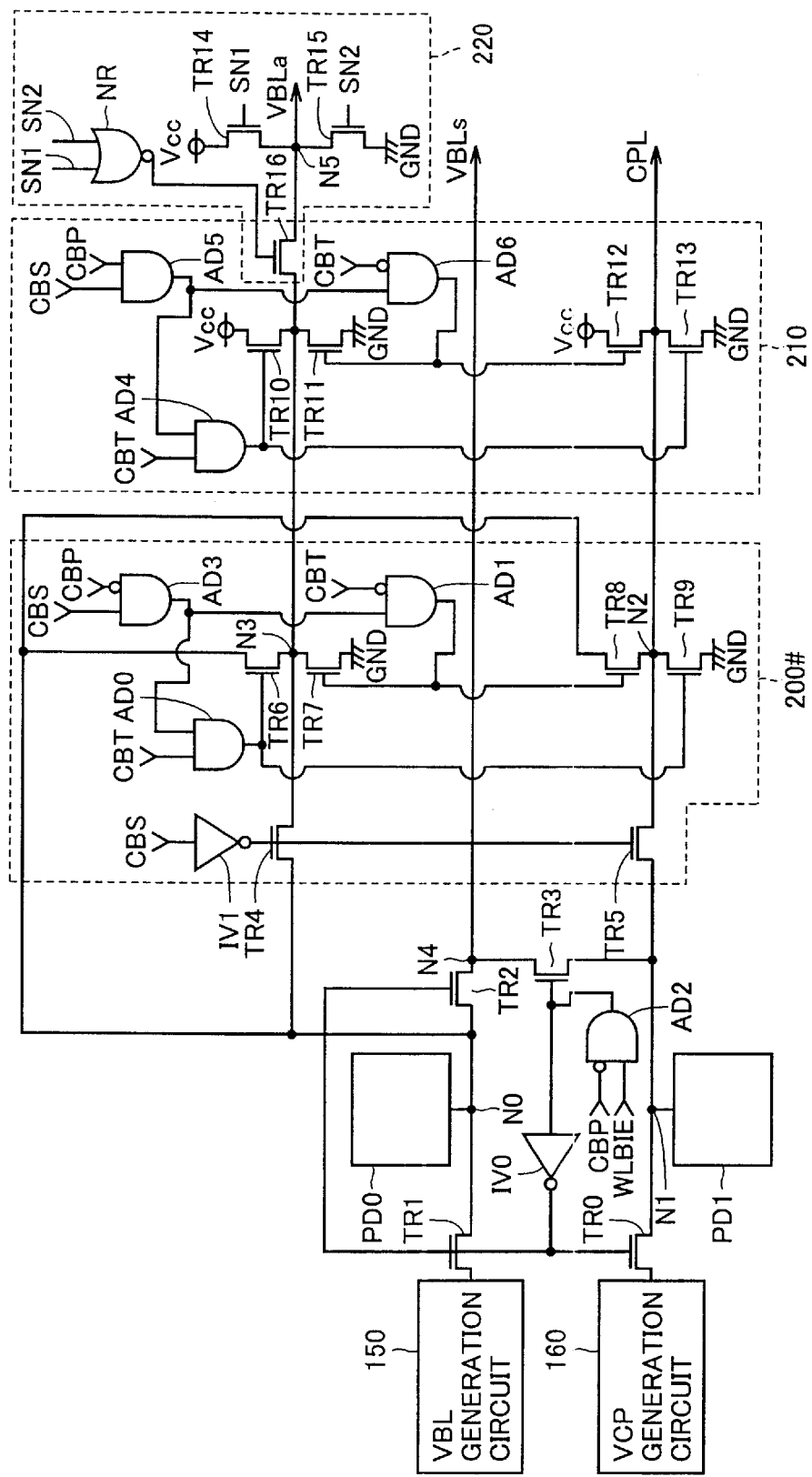
FIG. 17 is a schematic diagram of a voltage supply circuit according to a second embodiment of the present invention.

FIG. 17 schematically shows a voltage supply circuit according to the second embodiment of the present invention.

The voltage supply circuit of the second embodiment differs from the voltage supply circuit of the first embodiment shown in FIG. 7 in that an AND circuit AD2, a switch control unit 200# substituted for switch control unit 200, and switch control units 210 and 220 are additionally provided.

AND circuit AD2 receives an inverted signal of control signal CBP and a control signal WLBIE to output an AND logic operation result thereof The gate of transistor TR3 and inverter IV0 receive the output signal from AND circuit AD2.

Switch control unit 200# differs from switch control unit 200 in further including an AND circuit AD3. AND circuit AD3 receives control signal CBS and an inverted version of control signal CBP to output the AND logic operation result to the input nodes of AND circuits AD0 and AD1.

Switch control unit 210 further includes transistors TR10–TR13, and AND circuits AD4–AD6. Transistor TR10 disposed between power supply voltage Vcc and node N3 receives the output signal from AND circuit AD4 at its gate. Transistor TR11 disposed between node N3 and ground voltage GND receives the supply of an output signal from AND circuit AD6 at its gate. Transistor TR12 disposed between power supply voltage Vcc and node N2 receives the output signal from AND circuit AD6 at its gate. Transistor Tr13 disposed between node N2 and ground voltage GND receives the output signal from AND circuit AD4 at its gate. AND circuit AD4 receives control signal CBT and the output signal of AND circuit AD5 to output the AND logic operation result to respective gates of transistors TR10 and TR13. AND circuit AD6 receives an inverted version of control signal CBT and the output signal from AND circuit AD5 to provide the AND logic operation result to respective gates of transistors TR11 and TR12. AND circuit AD5 receives the inputs of control signals CBS and CBP to provide the AND logic operation result to respective input nodes of AND circuits AD4 and AD6.

In the second embodiment, control signal CBP functions to select, as necessary, one of switch control units 200# and 210.

Specifically, in response to control signal CBP (L level), switch control unit 200# executes, as necessary, a switching operation similar to that of switch control unit 200 described in the first embodiment in response to control signals CBS and CBT. Switch control unit 210 is at an inactive state when control signal CBP is at an L level, and does not execute a switching operation.

Switch control unit 200# attains an inactive state in response to a control signal CBP of an H level, and is inhibited of a switching operation. Switch control unit 210 responds to control signal CBP of an H level to execute, as necessary, switching operation in response to control signals CBS and CBT.

Switch control unit 220 includes transistors TR14–TR16 and NOR circuit NR. Transistor TR14 disposed between power supply voltage Vcc and node N5 receives an input of control signal SN1 at its gate. Transistor TR15 disposed between ground voltage GND and node N5 receives an input of control signal SN2 at its gate. Transistor TR16 disposed between node N3 and node N5 receives an output signal from NOR circuit NOR at its gate. NOR circuit NR receives the inputs of control signals SN1 and SN2 to provide the NOR logic operation result to the gate of transistor TR16.

Switch control unit 220 responds to control signals SN1 and SN2 to supply, as necessary, power supply voltage Vcc or ground voltage GND to voltage supply line VBLa.

Switch control unit 220 is used in the operation of writing data into a memory cell reliability testing. Specifically, power supply voltage Vcc is supplied to voltage supply line VBLa in response to control signal SN1 (H level). Ground voltage GND is supplied to voltage supply line VBLa in response to control signal SN2 (H level). In other words, control signals SN1 and SN2 are both set at an L level. Therefore, electrical coupling is established between nodes N3 and N5 based on the NOR logic operation result.

The relationship of control signals when stress is applied across voltage supply line CPL and bit line BL and when in a normal operation mode according to the second embodiment will be described with reference to FIG. 18.

First, a normal operation mode will be described. In this mode, control signals WLBIE, CBS, CBT and CBP are all set at an L level.

Figure 19:
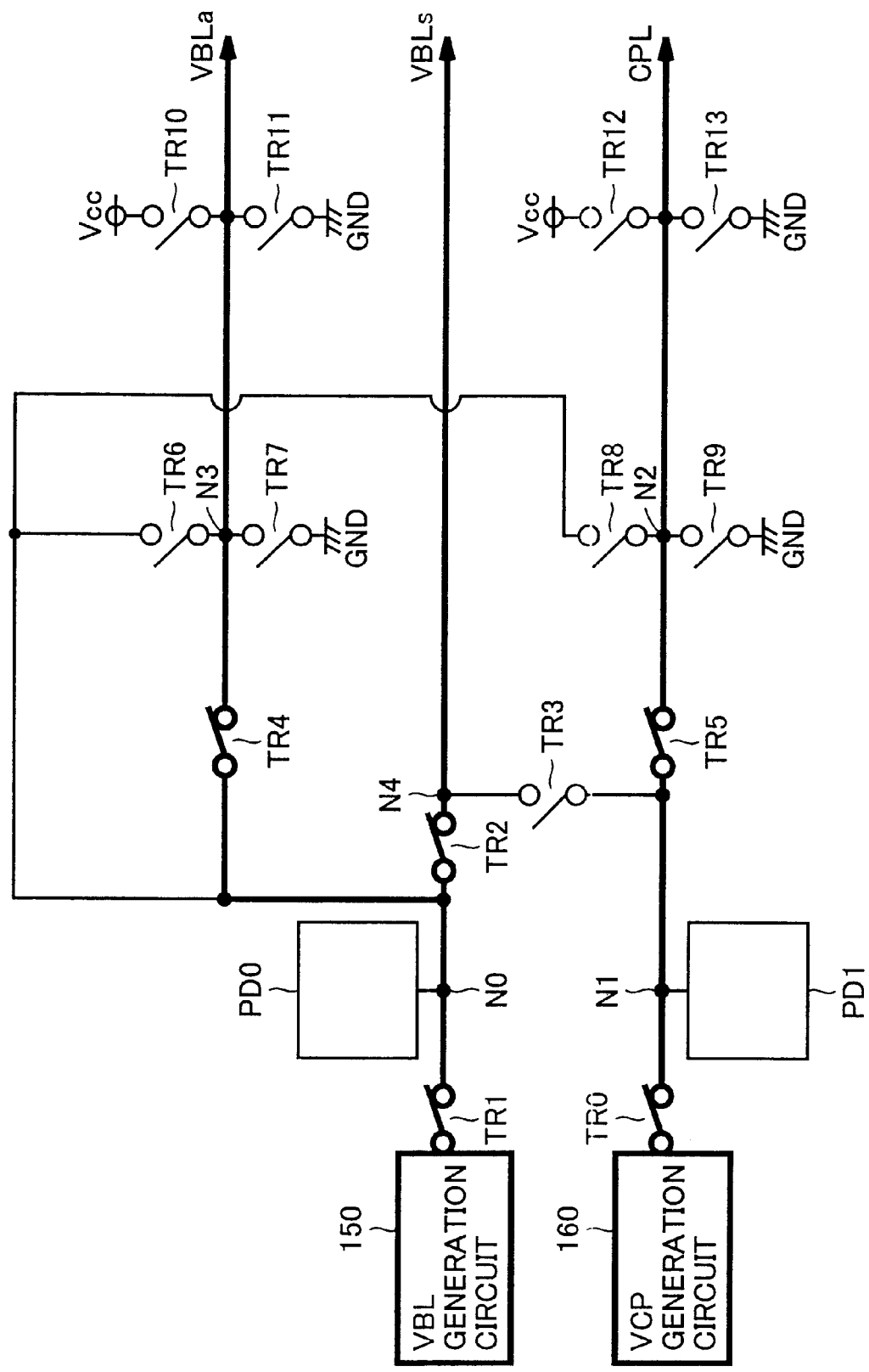
FIG. 19 schematically shows the supply path of the voltage supply circuit of the second embodiment in a normal operation mode.

Referring to FIGS. 18 and 19, switch control unit 200# is selected as described above since control signal CBP is at an L level. Specifically, a precharged voltage is supplied from VBL generation circuit 150 to voltage supply line VBLa via transistors TR1 and TR4 as described previously in the first embodiment. Also, precharge voltage is supplied from VBL generation circuit 150 to voltage supply line VBLs via transistors TR1 and TR2. A cell plate voltage is supplied from VCP generation circuit 160 to voltage supply line CPL via transistors TR0 and TR5.

The case corresponding to CPL-VBLa stress will be described. In this mode, control signals WLBIE, CBS, CBT and CBP are set at an H level, an H level, an L level, and an H level, respectively. Accordingly, switching control unit 210 is selected in response to control signal CBP.

Figure 20:
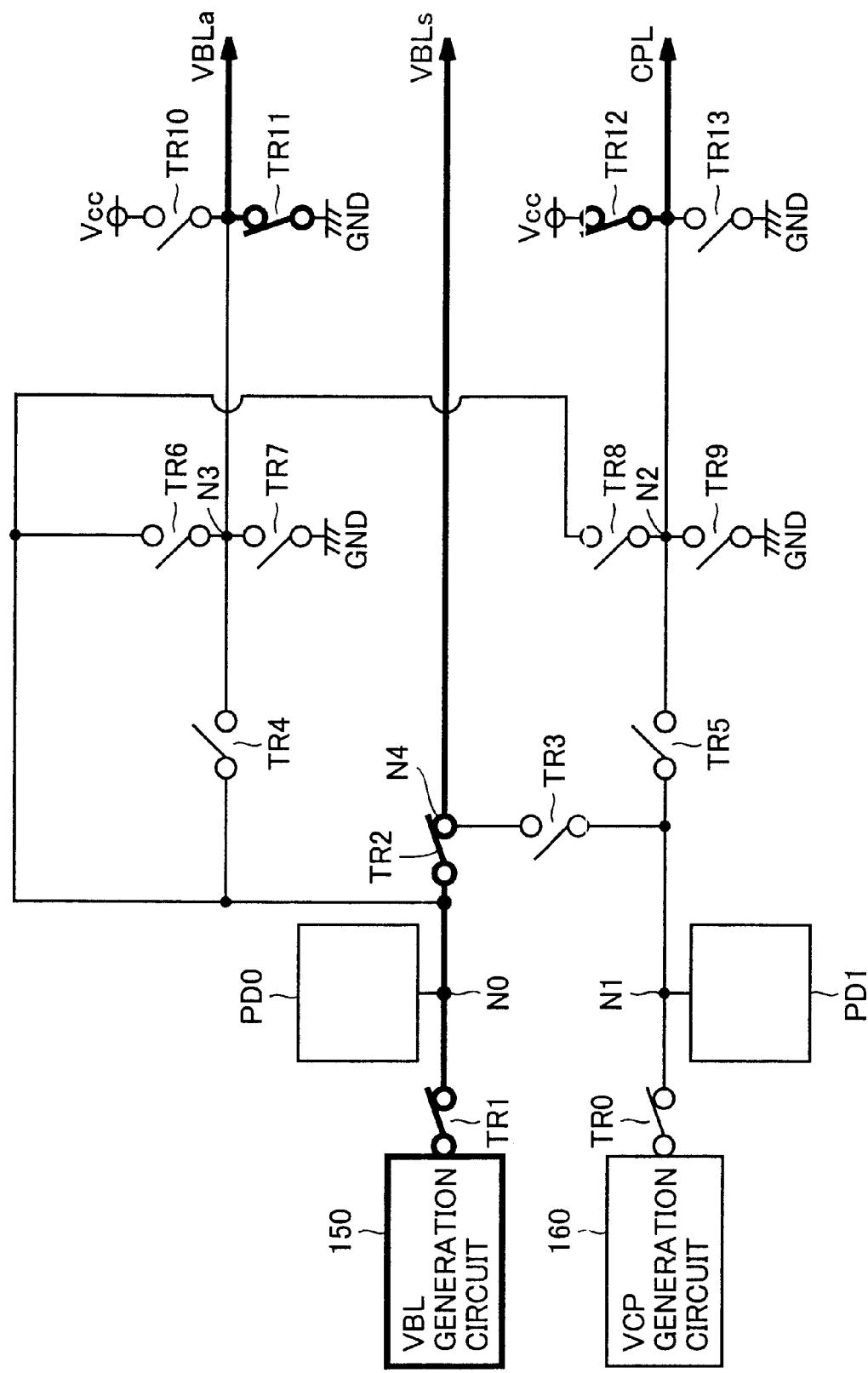
FIGS. 20 and 21 schematically show the supply path of the voltage supply circuit of the second embodiment when CPL-VBLa stress is executed and VBLa-CPL stress is executed, respectively.

Referring to FIGS. 18 and 20, transistors TR1 and TR2 are turned on in response to control signals CBS, CBT and CBP. Also, transistor TR11 is turned on. Accordingly, ground voltage GND is supplied to voltage supply line VBLa. Also, transistor TR12 is turned on. Accordingly, power supply voltage Vcc is supplied to voltage supply line CPL.

Thus, a CPL-VBLa stress mode can be executed in a manner similar to that described in the previous first embodiment.

Now, description proceeds to a VBLa-CPL stress mode. In a VBLa-CPL stress mode, control signals WLBIE, CBS, CBT and CBP are all set at an H level. Accordingly, switch control unit 210 is selected in response to control signal CBP.

Figure 21:
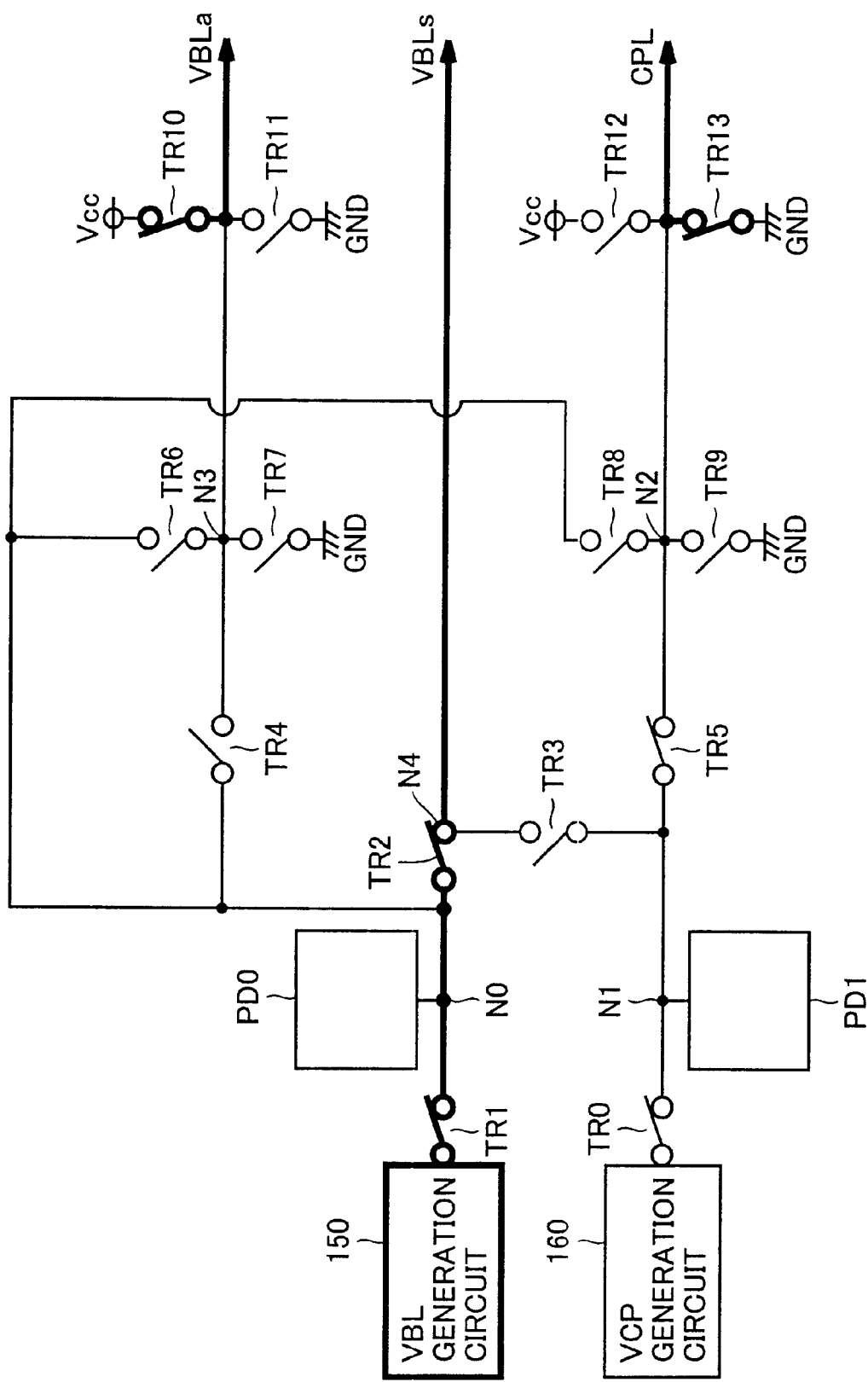

Referring to FIGS. 18 and 21, transistors TR1 and TR2 are turned on in response to control signals CBS, CBT and CBP. Also, transistor TR10 is turned on. Accordingly, ground voltage GND is supplied to voltage supply line VBLa. Also, transistor TR13 is turned on. Accordingly, power supply voltage Vcc is supplied to voltage supply line CPL.

Thus, a VBLa-CPL stress mode can be executed in a manner as described in the first embodiment. The above description is based on a structure of applying stress across power supply voltage Vcc-GND to voltage supply line CPL and bit lines BL and /BL. Alternatively, the level of power supply voltage Vcc can be boosted to the level of power supply voltage Vccb through a boosting circuit (not shown) for testing.

Various testing modes and the relationship between corresponding control signals and voltage supply lines of the second embodiment will be described with reference to FIG. 22.

Control signal WLBIE is set at an H level. Control signals CBS and CBT are set at an L level. Control signal CBP is set at an H level. Although switch control unit 210 is selected in response to control signal CBP (H level), switch control unit 210 will not execute a switching operation since control signals CBS and CBT are both at an L level. Therefore, the voltage supply circuit of the second embodiment has a supply path set similar to that of a normal operation mode shown in FIG. 19. In the present testing mode, switch control unit 220 is driven for a memory cell reliability testing. Since one of control signals SN1 and SN2 is set at an H level during the test, NOR circuit NR of switch control unit 220 outputs an L level. Therefore, transistor TR16 is turned off during the driving operation of switch control unit 220. Voltage supply from VBL generation circuit 150 to voltage supply line VBLa is ceased.

When data "1" is to be written into a memory cell, control signals SN1 and SN2 are set at an H level and an L level, respectively. Therefore, transistors TR16 and TR14 are turned off and on, respectively. Thus, power supply voltage Vcc is supplied to voltage supply line VBLa.

In the opposite case where data "0" is to be written into a memory cell, control signals SN1 and SN2 are set at an L level and an H level, respectively. Accordingly, transistors TR16 and TR17 are turned off and on, respectively. Therefore, ground voltage GND is supplied to voltage supply line VBLa.

Specifically, in the all WL activation mode and the even number and odd number activation modes, control signal SN1 (H level) and control signal SN2 (L level) are input. Accordingly, a burn-in test similar to that described in the previous first embodiment can be executed.

In a stripe type mode, control signal SN2 (H level) and control signal SN1 (L level) are input at step S1. Accordingly, ground voltage GND is supplied to voltage supply line VBLa. At step S2, control signals SN1(H level) and SN2 (L level) are input. Accordingly, power supply voltage Vcc is supplied to voltage supply line VBLa. At other steps S3–S5, control signals SN1 and SN2 are set at an L level. Accordingly, voltage ½ Vcc is supplied to voltage supply line VBLa.

By controlling the voltage supply circuit of the second embodiment through the usage of control signals CBS, CBT and CBP as well as control signals SN1 and SN2, a burn-in test similar to that described in the first embodiment can be executed.

The above description is based on a memory cell reliability test of executing data writing with power supply voltage Vcc and ground voltage GND supplied to bit lines BL and /BL. Alternatively, the level of power supply voltage Vcc can be boosted to the level of power supply voltage Vcca through a boosting circuit (not shown) for execution of data writing.

Although the above description is based on a device structure having two types of transistors of a thick film transistor and a thin film transistor, the present invention is also applicable to a device structure that employs one of the two types of transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells storing charge according to storage data;

a bit line connected to a selected memory cell of said plurality of memory cells in a data readout mode;

a peripheral circuit connected to said bit line in said data readout mode to execute data reading with respect to said selected memory cell;

an isolation unit to electrically isolate, as necessary, said bit lines into first and second regions of a bit line corresponding to said plurality of memory cells and said peripheral circuit respectively;

a first voltage supply line provided corresponding to a bit line in said first region;

a second voltage supply line provided corresponding to said peripheral circuit; and a voltage control circuit controlling a voltage to be supplied to said first and second voltage supply lines, said voltage control circuit supplying the same voltage to said first and second voltage supply lines in an operation mode, and supplying different voltages to said first and second voltage supply lines in a test mode.

2. The semiconductor memory device according to claim 1, wherein each of said memory cells comprises a first field effect transistor having a gate oxide film, said peripheral circuit comprises a sense amplifier to amplify the storage data of said selected memory cell, said sense amplifier comprises at least a second field effect transistor having a gate oxide film, and a gate oxide film of the first field effect transistor is designed thicker than the gate oxide film of said second field effect transistor.

3. The semiconductor memory device according to claim 2, wherein said isolation unit comprises a connection control unit establishing electrical coupling between the bit line of said first region and the bit line of said second region, said test mode includes first and second testing periods, said connection control unit isolates the bit line of said first region from the bit line of said second region in said first test period, and said connection control unit electrically couples the bit line of said first region with the bit line of said second region in said second test period.

4. The semiconductor memory device according to claim 1, wherein said plurality of memory cells are arranged in a matrix, said semiconductor memory device further comprising a plurality of word lines provided corresponding to respective memory cell rows, wherein a voltage of a level higher than the level in said data readout mode is supplied to at least one of said plurality of word lines in said test mode.

5. The semiconductor memory device according to claim 1, further comprising a transistor to provide connection between said first region and said first voltage supply line, wherein a precharge voltage to precharge a bit line of said first region is supplied to said first voltage supply line in said operation mode.

6. A semiconductor memory device comprising:

a memory cell storing charge according to storage data;

a bit line through which is transmitted a voltage level according to said storage data of said memory cell in a data readout mode; and a voltage supply line to supply a cell plate voltage to said memory cell, wherein said memory cell comprises
an access transistor provided between a storage node and said bit line, and turned on in said data readout mode, and
a capacitor provided between said storage node and said voltage supply line for retaining said charge,
said access transistor being turned off in a test mode,
said semiconductor memory device further comprising a voltage control circuit supplying different voltages to said voltage supply line and said bit line in said test mode.

7. The semiconductor memory device according to claim 6, wherein said voltage control circuit comprises
a first voltage supply circuit supplying a predetermined voltage to precharge said bit line,
a second voltage supply circuit to supply said cell plate voltage to said voltage supply line, and
a switch circuit ceasing supply from said first and second voltage supply circuits to said bit line and said voltage supply line, respectively, and supplying first and second test voltages to said bit line and said voltage supply line, respectively, in said test mode.

8. The semiconductor memory device according to claim 7, wherein said switch circuit includes first and second external pads connected to said bit line and said voltage supply line, respectively, in said test mode,
said first and second external pads receiving supply of one and the other of said first and second test voltages, respectively, in said test mode.

9. The semiconductor memory device according to claim 6, wherein said memory cell is designed with a structure in which said bit line and said voltage supply line are located relatively in close proximity (COB structure).

* * * * *